(12) United States Patent
Kawamata et al.

(10) Patent No.: US 7,656,220 B2
(45) Date of Patent: *Feb. 2, 2010

(54) SEMICONDUCTOR DEVICE EMPLOYING FUSE CIRCUIT AND METHOD FOR SELECTING FUSE CIRCUIT SYSTEM

(75) Inventors: Yosuke Kawamata, Tokyo (JP); Makoto Kitayama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/300,408

(22) Filed: Dec. 15, 2005

(65) Prior Publication Data

US 2006/0125549 A1    Jun. 15, 2006

(30) Foreign Application Priority Data

Dec. 15, 2004    (JP) .............................. 2004-362302
Dec. 22, 2004    (JP) .............................. 2004-371189

(51) Int. Cl.
*H01H 37/76*    (2006.01)
*H01H 85/00*    (2006.01)

(52) U.S. Cl. ....................................... 327/525; 365/200

(58) Field of Classification Search ......... 327/525–526; 363/200, 225

See application file for complete search history.

(56) References Cited

U.S. PATENT DOCUMENTS 6,125,069 A * 9/2000 Aoki ...................... 365/225.7

7,116,590 B2 * 10/2006 Blodgett .................... 365/200

FOREIGN PATENT DOCUMENTS

| JP | 05-298894 | 11/1993 |
|---|---|---|
| JP | 6-044795 | 2/1994 |
| JP | 6-119796 | 4/1994 |
| JP | 9-069299 | 3/1997 |
| JP | 2005-222658 | 8/2005 |

OTHER PUBLICATIONS

Japanese Office Action, w/ partial English translation thereof, issued in Japanese Patent Application No. JP 2004-371189 dated Feb. 3, 2009.

* cited by examiner

*Primary Examiner*—Quan Tra
(74) *Attorney, Agent, or Firm*—McDermott Will & Emery LLP

(57) ABSTRACT

Disclosed are a semiconductor device capable of reducing the number of program fuses used therein, and a fuse circuit selection method capable of reducing the number of program fuses. The semiconductor device includes: a fuse circuit (11) and an entire inversion fuse circuit (12), each of which includes plural program fuses, and which store desired addresses based on cutting patterns of the plural program fuses, wherein the fuse circuit (11) and the entire inversion fuse circuit (12) are configured to be capable of storing addresses different from each other based on the same cutting pattern. As described above, since plural types of the cutting patterns of the program fuses exist even in the same address, the fuse circuit for use is appropriately selected, thus it is made possible to reduce the number of fuse elements to be cut as a whole. Thus, manufacturing cost of the semiconductor device can be reduced, and in addition, it is made possible to enhance reliability of the semiconductor device.

9 Claims, 25 Drawing Sheets

| ADDRESS TO BE STORED | FUSE CIRCUIT | | | | | | | |
|---|---|---|---|---|---|---|---|---|
| | 11A | 11B | 11C | 11D | 11E | 11F | 11G | 11H |
| ADDRESS#1 | 10 | ③ | ③ | 5 | 6 | 5 | 4 | 8 |
| ADDRESS#2 | 0 | 8 | 2 | 4 | 3 | 10 | ① | 5 |
| ADDRESS#3 | 8 | 8 | ⑤ | 6 | 11 | 6 | 7 | 9 |
| ADDRESS#4 | 6 | 5 | 5 | 12 | 8 | ④ | 7 | 6 |
| ADDRESS#5 | 11 | ④ | 0 | ④ | 7 | 5 | 8 | ④ |
| ADDRESS#6 | 6 | 10 | 8 | 9 | 6 | 7 | ③ | 5 |
| ADDRESS#7 | 7 | ③ | 6 | 6 | 9 | 5 | ③ | 11 |
| ADDRESS#8 | 4 | 11 | 3 | 5 | 4 | 8 | ② | 3 |
| FL FLAG | | 🏳 | 🏳 | | | | 🏳 | |
| OF FLAG | | 🏳 | | | | | 🏳 | |

→PROCESSING-REQUIRED ROW(11B)
→PROCESSING-REQUIRED ROW(11G)
→PROCESSING-REQUIRED ROW(11B)
→PROCESSING-REQUIRED ROW(11G)
→PROCESSING-REQUIRED ROW(11B,11G)
→PROCESSING-REQUIRED ROW(11G)

← PROCESSING-REQUIRED COLUMN
PROCESSING-REQUIRED COLUMN ← PROCESSING-REQUIRED COLUMN

| ADDRESS TO BE STORED | FUSE CIRCUIT | | | | | | | |
|---|---|---|---|---|---|---|---|---|
| | 11A | 11B | 11C | 11D | 11E | 11F | 11G | 11H |
| ADDRESS#1 | 10 | 0 | ③ | 5 | 6 | 5 | 4 | 8 |
| ADDRESS#2 | 0 | 8 | 2 | 4 | 3 | 10 | ① | 5 |
| ADDRESS#3 | 8 | 8 | ⑤ | 6 | 11 | 6 | 7 | 9 |
| ADDRESS#4 | 6 | 5 | 5 | 12 | 8 | ④ | 7 | 6 |
| ADDRESS#5 | 11 | 0 | 0 | ④ | 7 | 5 | 8 | ④ |
| ADDRESS#6 | 6 | 10 | 8 | 9 | 6 | 7 | ③ | 5 |
| ADDRESS#7 | 7 | ③ | 6 | 6 | 9 | 5 | 0 | 11 |
| ADDRESS#8 | 4 | 11 | 3 | 5 | 4 | 8 | ② | 3 |
| FL FLAG | | | ⚑ | | | | ⚑ | |
| OF FLAG | | | | | | | ⚑ | |

← PROCESSING-REQUIRED ROW (11G)
← PROCESSING-REQUIRED ROW (11G)
← PROCESSING-REQUIRED ROW (11G)

↑ PROHIBITED COLUMN
↑ PROCESSING-REQUIRED COLUMN

| ADDRESS TO BE STORED | FUSE CIRCUIT | | | | | | | |
|---|---|---|---|---|---|---|---|---|
| | 11A | 11B | 11C | 11D | 11E | 11F | 11G | 11H |
| ADDRESS#1 | 10 | 0 | (3) | 5 | 6 | 5 | 4 | 8 |
| ADDRESS#2 | 0 | 8 | 2 | 4 | 3 | 10 | (1) | 5 |
| ADDRESS#3 | 8 | 8 | (5) | 6 | 11 | 6 | 7 | 9 |
| ADDRESS#4 | 6 | 5 | 5 | 12 | 8 | (4) | 7 | 6 |
| ADDRESS#5 | 11 | 0 | 0 | (4) | 7 | 5 | 8 | (4) |
| ADDRESS#6 | 6 | 10 | 8 | 9 | 6 | 7 | (3) | 5 |
| ADDRESS#7 | 7 | (3) | 6 | 6 | 9 | 5 | 0 | 11 |
| ADDRESS#8 | 4 | 11 | 3 | 5 | 4 | 8 | 0 | (3) |
| FL FLAG | | | ⚑ | | | | ⚑ | |
| OF FLAG | | | | | | | | |

↑ PROHIBITED COLUMN        ↑ PROHIBITED COLUMN

FIG.24

SEMICONDUCTOR DEVICE EMPLOYING FUSE CIRCUIT AND METHOD FOR SELECTING FUSE CIRCUIT SYSTEM

TECHNICAL FIELD

The present invention relates to a semiconductor device, and more particularly to a semiconductor device including a fuse circuit for storing a defective address and the like. Moreover, the present invention relates to a method for selecting the fuse circuit, and more particularly to a method for selecting the fuse circuit to be actually used in the case of allowing a plurality of the fuse circuits included in the semiconductor device to individually store the defective addresses and the like.

BACKGROUND OF THE INVENTION

A memory capacity of a semiconductor memory represented by a Dynamic Random Access Memory (DRAM) has been increased year by year owing to a progress of micromachining technologies. It is actual circumstances that, the more the semiconductor device has become micro, the more the number of defective memory cells included per chip has been increased. Such defective memory cells are usually replaced by redundant memory cells, and an address having a defect is thus relieved.

In general, the address having a defect is stored in a fuse circuit including plural program fuses, and when an access to the address concerned is requested, an alternative access will be made by a control of the fuse circuit not to the defective memory cells but to the redundant memory cells.

With regard to a configuration of the fuse circuit, as described in Japanese Patent Laid-Open Nos. H9 (1997)-69299 and H6 (1994)-44795, there is known a system of storing a desired address by assigning a pair (two) of program fuses to each bit constituting an address to be stored and by cutting either one thereof. However, this system has a problem that it is necessary to prepare extremely many program fuses on a chip since two program fuses are required for each bit, resulting in an increase of a circuit area occupied by the fuse circuit.

Moreover, while the program fuse is usually cut by being irradiated with a laser beam, one program fuse must be cut for each bit without fail in the above-described system. Accordingly, the above-described system has a problem that the number of program fuses to be cut is relatively increased, and as a result, a time required for a step of cutting the fuses is lengthened and therefore manufacturing efficiency of the semiconductor device is reduced. Moreover, the above-described system also has a problem that a lifetime of a fuse cutting apparatus is shortened when the number of program fuses to be cut is large, leading to an increase in manufacturing cost of the semiconductor device. Furthermore, since a success rate of the cutting by the fuse cutting apparatus is not always 100%, another problem may also occur, in which an occurrence probability of a product failure owing to a cutting error is increased in response to the increase in the number of program fuses to be cut, leading to damage on reliability of the semiconductor device as an end product.

As opposed to this, as described in Japanese Patent Laid-Open No. H6 (1994)-119796, a system of assigning one program fuse to each of bits constituting the address to be stored is also known. In this system, a match or mismatch between a logical value stored in the program fuse and a logical value given by an access is detected by using an exclusive OR circuit (EXOR), an exclusive NOR circuit (EXNOR), and the like, and when the logical values match with each other in the entire bits (or mismatch with each other in the entire bits), a match (HIT) between the stored address and an address given by the access is detected.

As described above, according to the system described in Japanese Patent Laid-Open No. H6 (1994)-119796, it is made possible to reduce the number of program fuses to be cut to a large extent as compared with the systems described in Japanese Patent Laid-Open Nos. H9 (1997)-69299 and H6 (1994)-44795. However, it has not always been possible to reduce the number of program fuses to be cut to a large extent since the number of program fuses to be actually cut strongly depends on a bit configuration of the address to be stored.

SUMMARY OF THE INVENTION

It is therefore an object of the present invention to provide a semiconductor device and a method for selecting a fuse circuit, which are capable of enhancing the manufacturing efficiency of the semiconductor device and reducing the manufacturing cost of the semiconductor device by reducing the number of program fuses to be cut.

The above and other objects of the present invention can be accomplished by a semiconductor device, comprising: plural fuse circuits, each of which includes plural program fuses, and which store desired addresses based on cutting patterns of the plural program fuses, wherein at least two of the plural fuse circuits are configured to be capable of storing addresses different from each other based on a same cutting pattern.

According to the present invention, plural types of the cutting patterns of the program fuses exist even in the same address, and accordingly, the fuse circuits for use are appropriately selected, thus making it possible to reduce the number of fuse elements to be cut as whole. Thus, the manufacturing cost of the semiconductor device can be reduced, and in addition, it is made possible to enhance the reliability of the semiconductor device.

It is preferable that each of the plural fuse circuits includes a hit detection unit which detects a match between an address stored based on the cutting patterns of the plural program fuses and a selected address, and means for activating the hit detection unit.

As the activating means, an enable fuse which is cut to activate the hit detection unit corresponding thereto may be used, or a use determination unit which activates the hit detection unit in response to the fact that at least one of the plural program fuses is cut may be used. According to a method using the latter means, the enable fuse is unnecessary. Therefore, the number of fuse elements can be reduced as a whole of the semiconductor device, and in addition, it is made possible to further reduce the number of fuse elements to be cut as a whole.

The above and other objects of the present invention can also be accomplished by a fuse circuit selection method for selecting a fuse circuit for use out of plural types of fuse circuits configured to be capable of storing addresses different from each other based on a same cutting pattern of plural program fuses, the method comprising: counting the number of cut program fuses necessary in a case of allowing each fuse circuit to store a predetermined address for each type of the fuse circuits; and preferentially assigning, as a fuse circuit for the predetermined address, a fuse circuit capable of storing the predetermined address by a smaller number of cut program fuses.

The above and other objects of the present invention can also be accomplished by a fuse circuit selection method for selecting a fuse circuit for use from plural fuse circuits including first and second types of fuse circuits configured to be capable of storing addresses different from each other based on a same cutting pattern of plural program fuses, wherein, for at least a part of bits constituting the address to be stored, it is determined which of the number of bits having one logical values and the number of bits having other logical values is larger, when the number of bits having the one logical values is larger, the first type of fuse circuits is selected, and when the number of bits having the other logical values is larger, the second type of fuse circuits is selected.

According to the methods of the present invention, the number of fuse elements to be cut can be suppressed, and accordingly, the manufacturing cost of the semiconductor device can be reduced, and it is made possible to enhance reliability of the semiconductor device.

As described above, according to the present invention, the number of program fuses to be cut can be reduced, and accordingly, it is made possible to enhance manufacturing efficiency of the semiconductor device, and to reduce the manufacturing cost of the semiconductor device.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 22 is a diagram showing an example of a table;

FIG. 23 shows a result of repeatedly performing the processing (S52 to S55) for the table of the number of cut program fuses; and FIG. 24 shows a result of repeatedly performing the processing (S52 to S56) for the table of the number of cut program fuses.

DETAILED DESCRIPTION OF THE EMBODIMENTS

Preferred embodiments of the present invention will now be explained in detail with reference to the drawings.

Figure 1:
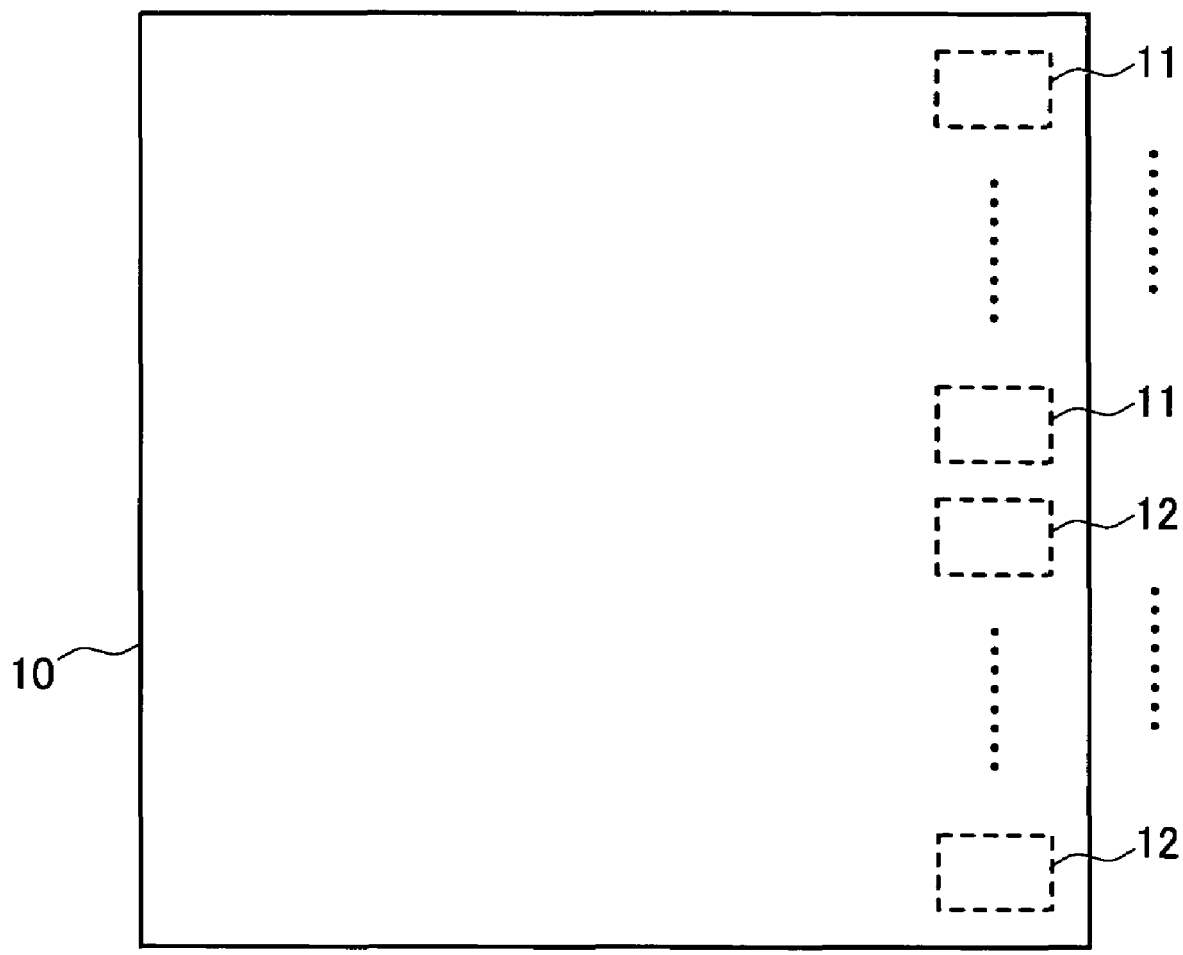
FIG. 1 is a plan view schematically showing a configuration of a semiconductor device according to a first embodiment of the present invention.

FIG. 1 is a plan view schematically showing a configuration of a semiconductor device 10 according to a first embodiment of the present invention.

The semiconductor device 10 according to this embodiment includes the plurality of fuse circuits 11 and a plurality of entire inversion fuse circuits 12, as well as a main circuit (not shown). A type of the main circuit is not particularly limited, and the main circuit may be a memory circuit such as a DRAM, or may be a logic circuit such as a CPU. In this embodiment, the fuse circuits 11 and the entire inversion fuse circuits 12 are provided by the same number.

Figure 2:
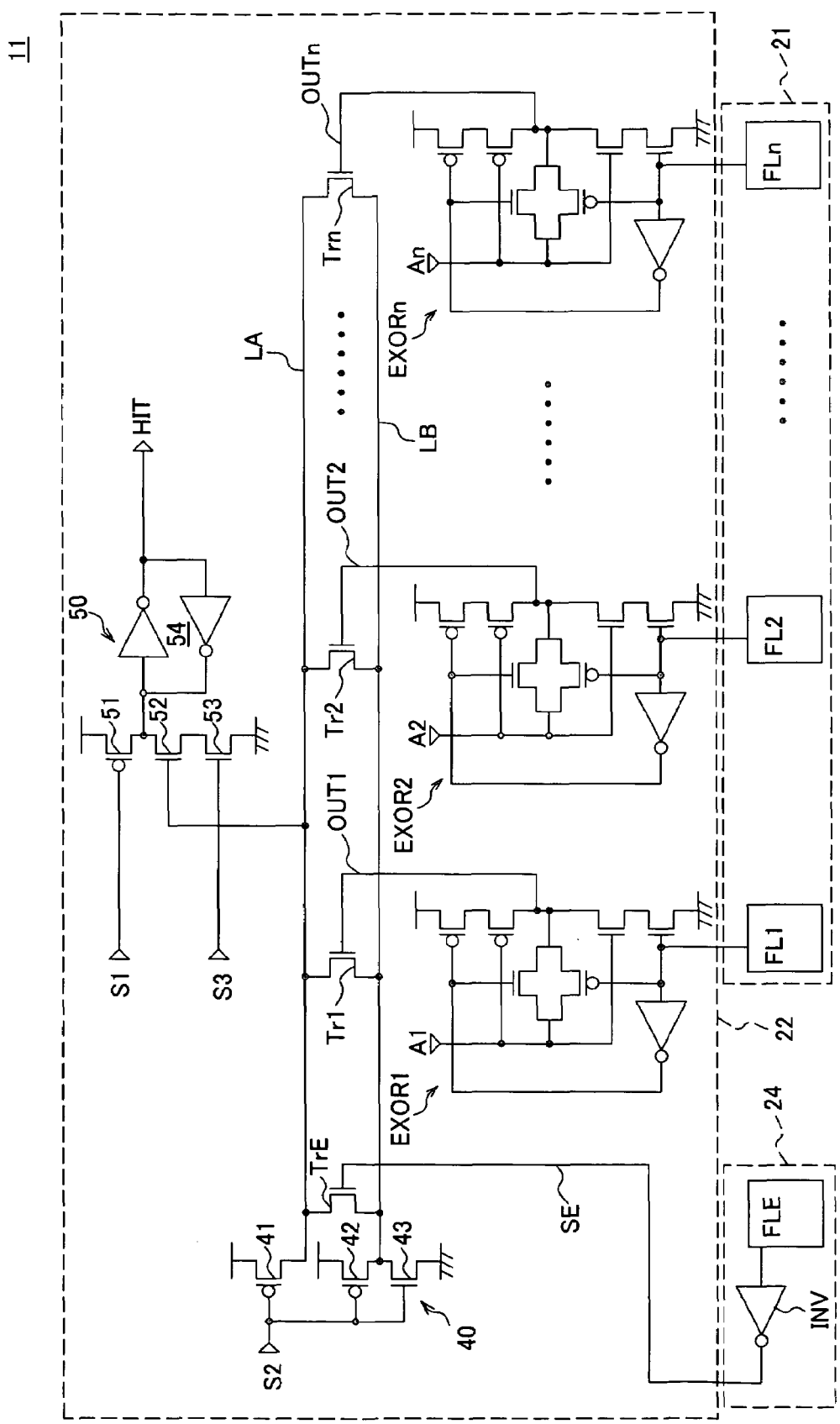
FIG. 2 is a circuit diagram of the fuse circuit shown in FIG. 1.

FIG. 2 is a circuit diagram of the fuse circuit 11.

As shown in FIG. 2, the fuse circuit 11 is composed of a storage circuit group 21 formed of a plurality of storage circuits FL1 to FLn, a hit detection unit 22 which detects a match between an address stored in the storage circuit group 21 and a selected address (to which an access is requested), and an enable circuit 24 storing information about whether the fuse circuit 11 is used or not.

The n pieces of storage circuits FL1 to FLn constituting the storage circuit group 21 correspond to the respective bits of an address to be stored. Hence, the address storable by one storage circuit group 21 is one. A specific circuit configuration of each of the storage circuits FL1 to FLn is not particularly limited as long as it is possible to fix each of the outputs F1 to Fn at a high level or a low level depending on whether or not a program fuse included therein is cut. However, as an example, it is possible to use a circuit shown in FIG. 3.

Figure 3:
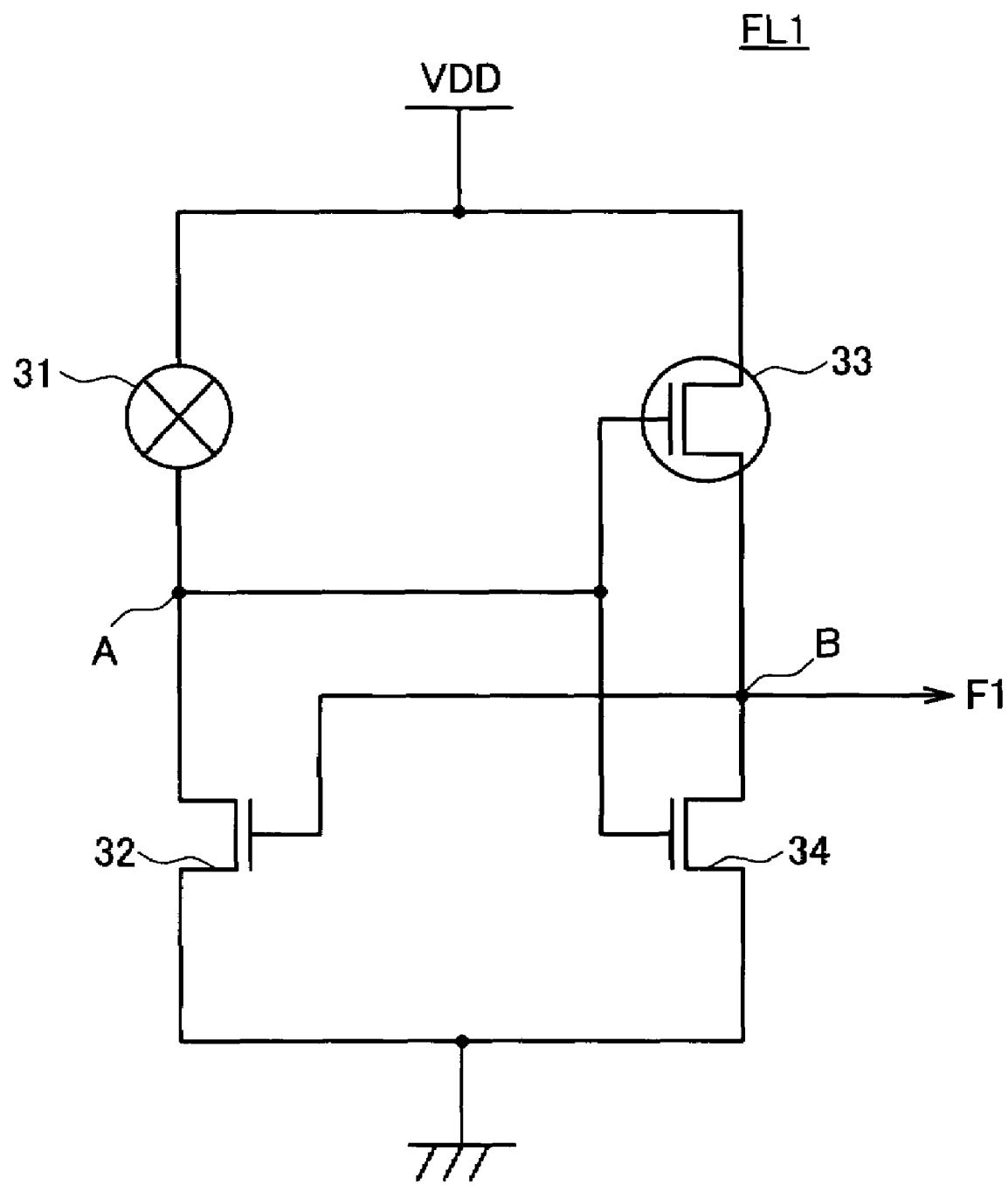
FIG. 3 is a circuit diagram showing an example of the specific circuit configuration of the storage circuit FL1.

FIG. 3 is a circuit diagram showing an example of the specific circuit configuration of the storage circuit FL1.

As shown in FIG. 3, the storage circuit FL1 includes a program fuse 31 and an N-channel MOS transistor 32, which are connected to each other in series between a power supply potential VDD and a ground potential GND, and a P-channel MOS transistor 33 and an N-channel MOS transistor 34, which are also connected to each other in series between the power supply potential VDD and the ground potential GND. The storage circuit FL1 has a configuration, in which a junction point A between the program fuse 31 and the transistor 32 is commonly connected to gate electrodes of the transistors 33 and 34, and a junction point B (output terminal) between the transistor 33 and the transistor 34 is connected to a gate electrode of the transistor 32.

With such a configuration, when the program fuse 31 is cut, since a potential of the junction point A drops to the low level, the junction point B as the output terminal is connected to the power supply potential VDD through the transistor 33, and accordingly, the output F1 is fixed at the high level. On the contrary, when the program fuse 31 is uncut, since the potential of the junction point A rises to the high level, the junction point B as the output terminal is connected to the ground potential GND through the transistor 34, and accordingly, the output F1 is fixed at the low level.

Note that circuits similar to the circuit shown in FIG. 3 can also be used for the other storage circuits FL2 to FLn. It is possible to cut the program fuse 31 by irradiating the program fuse 31 concerned with a laser beam by using a fuse cutting apparatus.

In this embodiment, when each of the storage circuits FL1 to FLn included in the fuse circuit 11 is allowed to store a logical value "1", the program fuse 31 corresponding thereto is cut, and when each of the storage circuits FL1 to FLn is allowed to store a logical value "0", the program fuse 31 corresponding thereto is left uncut. Thus, among the storage circuits FL1 to FLn, the outputs of the storage circuits each storing the logical value "1" rise to the high level, and the outputs of the storage circuits each storing the logical value "0" drop to the low level.

As shown in FIG. 2, the hit detection unit 22 includes exclusive OR circuits EXOR1 to EXORn provided correspondingly to the storage circuits FL1 to FLn, a precharge circuit 40 which charges a precharge wire LA and a discharge wire LB in response to a timing signal S2, discharge transistors Tr1 to Trn and an enable transistor TrE which are provided in parallel between the precharge wire LA and the discharge wire LB, and an output circuit 50 connected to the precharge wire LA. A specific description will be made below of configurations of the respective components included in the hit detection unit 22.

First, the exclusive OR circuits EXOR1 to EXORn are provided correspondingly to the storage circuits FL1 to FLn as described above, and are circuits which individually receive the outputs F1 to Fn from the corresponding storage circuits FL1 to FLn and bit signals A1 to An constituting the selected address and individually output hit signals OUT1 to OUTn as exclusive OR signals thereof. Hence, when logical values of the outputs F1 to Fn and those of the bit signals A1 to An individually corresponding thereto match with each other, the respective exclusive OR circuits EXOR1 to EXORn drop, to the low level, the hit signals OUT1 to OUTn corresponding to the outputs F1 to Fn and the bit signals A1 to An. When the logical values do not match with each other, the exclusive OR circuits EXOR1 to EXORn raise the corresponding hit signals OUT1 to OUTn to the high level.

The precharge circuit 40 is composed of P-channel MOS transistors 41 and 42, and an N-channel MOS transistor 43. A drain of the transistor 41 is connected to the precharge wire LA, and a junction point between the transistors 42 and 43 is connected to the discharge wire LB. The timing signal S2 is commonly supplied to gate electrodes of the respective transistors 41 to 43. Accordingly, when the timing signal S2 drops to the low level, both of the precharge wire LA and the discharge wire LB are charged up to the power supply potential VDD, and when the timing signal S2 rises to the high level, the discharge wire LB is connected to the ground potential GND.

As described above, the discharge transistors Tr1 to Trn and the enable transistor TrE are provided in parallel between the precharge wire LA and the discharge wire LB. To gate electrodes of the discharge transistors Tr1 to Trn, the hit signals OUT1 to OUTn from the exclusive OR circuits EXOR1 TO EXORn are supplied, respectively. Hence, when at least one of the hit signals OUT1 to OUTn is at the high level, the precharge wire LA and the discharge wire LB will be short-circuited.

Moreover, an enable signal SE is supplied to a gate electrode of the enable transistor TrE. Accordingly, even when the enable signal SE is at the high level, the precharge wire LA and the discharge wire LB will be short-circuited. The enable signal SE is a signal generated by the enable circuit 24.

The output circuit 50 is composed of a P-channel MOS transistor 51 and N-channel MOS transistors 52 and 53, which are connected in series to one another, and a latch circuit 54. A junction point between the transistor 51 and the transistor 52 is connected to the latch circuit 54. To gate electrodes of the transistors 51 and 53, a timing signal S1 and a timing signal S3 are supplied, respectively.

Meanwhile, a gate electrode of the transistor 52 is connected to the precharge wire LA. With such a configuration, when the timing signal S1 drops to the low level, a hit signal HIT as an output of the latch circuit 54 drops to the low level. Moreover, when the timing signal S3 rises to the high level in a state where the precharge wire LA stays at the high level, the hit signal HIT as the output of the latch circuit 54 rises to the high level, and a notice on the HIT is issued.

As shown in FIG. 2, the enable circuit 24 is composed of a storage circuit FLE, and an inverter INV which inverts an output of the storage circuit FLE. A specific circuit configuration of the storage circuit FLE is entirely the same as the circuit configurations of the other storage circuits FL1 to FLn, and the storage circuit FLE is only different from the other storage circuits FL1 to FLn in that a program fuse included therein is used as the "enable fuse".

Specifically, in the case of setting the fuse circuit 11 in the used state (a state where the HIT detecting operation is performed), the enable fuse included in the storage circuit FLE is cut, and in the case of setting the fuse circuit 11 in the unused state (a state where the HIT detecting operation is not performed), the enable fuse included in the storage circuit FLE is left uncut. Thus, when the enable fuse included in the storage circuit FLE is cut, the hit detection unit 22 is activated since the enable signal SE drops to the low level. On the contrary, when the enable fuse included in the storage circuit FLE is not cut, the hit detection unit 22 is inactivated since the enable signal SE rises to the high level.

The enable signal SE takes the activate state, when it is at the low level. In this case, the hit detection unit 22 is activated. When the enable signal SE is at the low level, the enable transistor TrE is always maintained in the OFF state, and accordingly, the hit detecting operation by the hit detection unit 22 takes an enabled state. Such a state means that the fuse circuit 11 concerned is in a "used state". Here, "the hit detection unit 22 is activated" means a state where it is made possible to perform the hit detecting operation between the outputs F1 to Fn from the storage circuits FL1 to FLn and the bit signals A1 to An corresponding thereto.

On the contrary, when the enable signal SE is at the high level, the enable transistor TrE is always maintained in the ON state, and accordingly, the hit detecting operation by the hit detection unit 22 takes an invalidated state. Such a state means that the fuse circuit 11 concerned is in an "unused state". Here, "the hit detection unit 22 is inactivated" means that the hit detecting operation between the outputs F1 to Fn from the storage circuits FL1 to FLn and the corresponding bit signals A1 to An is invalidated.

The above is a specific circuit configuration of the fuse circuit 11. Next, a description will be made of a specific configuration of each entire inversion fuse circuits 12.

Figure 4:
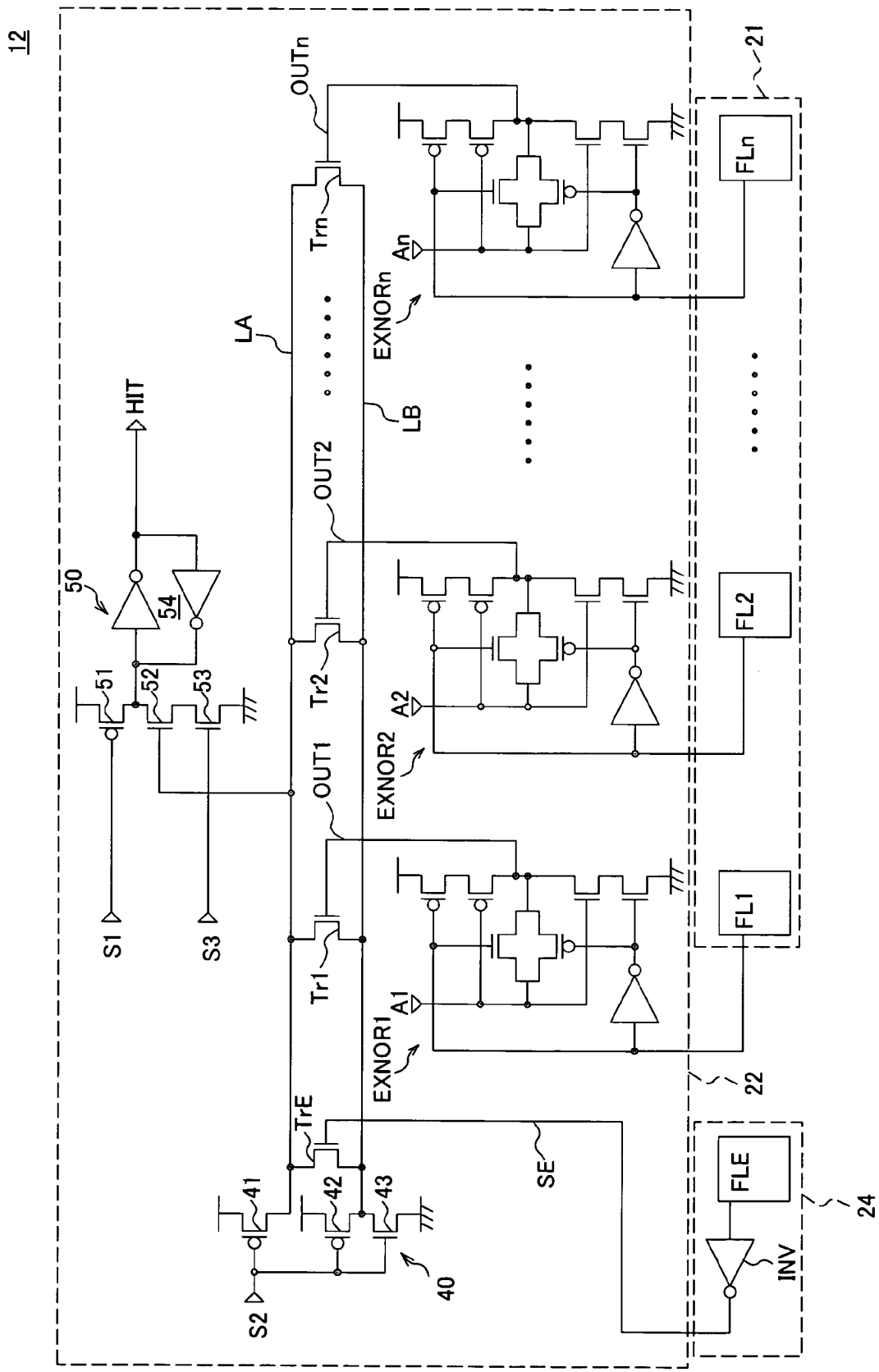
FIG. 4 is a circuit diagram of the entire inversion fuse circuit shown in FIG. 1.

FIG. 4 is a circuit diagram of the entire inversion fuse circuit 12.

As shown in FIG. 4, the entire inversion fuse circuit 12 has a configuration in which the exclusive OR circuits EXOR1 to EXORn included in the fuse circuit 11 shown in FIG. 2 are replaced by exclusive NOR circuits EXNOR1 to EXNORn. Other configurations are the same as those of the fuse circuit 11, and accordingly, the same reference numerals and symbols are assigned to the same constituents, and a duplicate description will be omitted.

In the case of allowing the entire inversion fuse circuit 12 to store the desired address, it is necessary to allow the entire inversion fuse circuit 12 to store the logical values of the respective bits constituting the address concerned while entirely inverting the logical values concerned.

Specifically, in the case of allowing the respective storage circuits FL1 to FLn included in the entire inversion circuit 12 to store the logical values "1", the program fuses 31 corresponding thereto are set in the uncut state, and in the case of allowing the storage circuits FL1 to FLn to store the logical values "0", the corresponding program fuses 31 are cut. Thus, in the entire inversion fuse circuit 12, among the storage circuits FL1 to FLn, the outputs of the storage circuits which store the logical values "1" drop to the low level, and the outputs of the storage circuits which store the logical values "0" rise to the high level.

With such a configuration, in the entire inversion fuse circuit 12, when the outputs F1 to Fn from the storage circuits FL1 to FLn and the bit signals A1 to An corresponding thereto do not match with each other, the hit signals OUT1 to OUTn are activated to the low level. Thus, it is possible for the entire inversion fuse circuit 12 to perform substantially the same operation as that of the fuse circuit 11.

As described foregoing, the fuse circuit 11 and the entire inversion fuse circuit 12 are configured to be capable of storing addresses different from each other based on a same cutting pattern of the plural program fuses.

Next, operations of the fuse circuits 11 and 12 will be described in more detail while referring to timing charts of FIG. 5 to FIG. 7.

Figure 5:
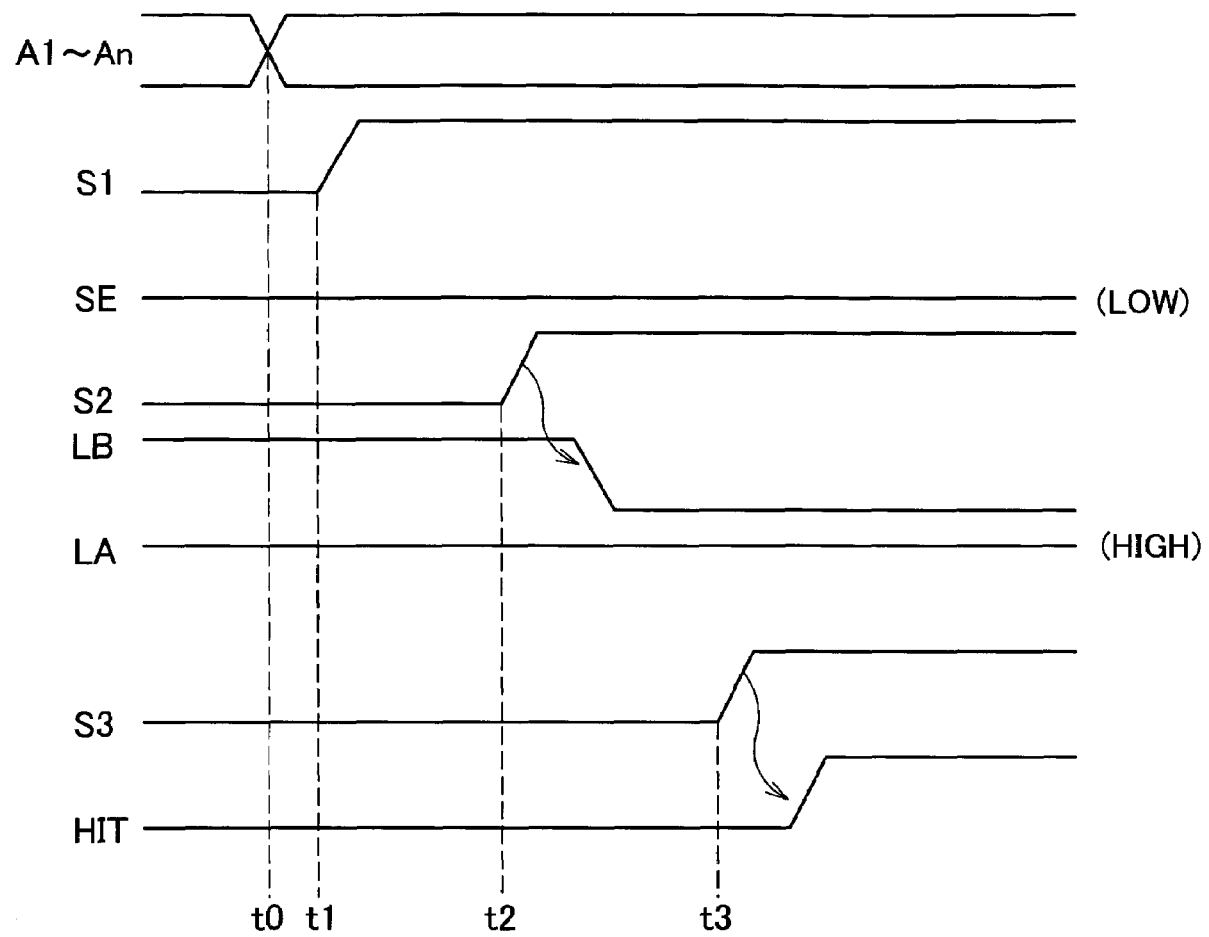
FIG. 5 is a timing chart showing an operation of the fuse circuit when the HIT is detected in the used state (a state where the enable fuse is cut)

FIG. 5 is a timing chart showing an operation of the fuse circuits 11 and 12 when the HIT is detected in the used state (a state where the enable fuse is cut).

First, in an initial state, the timing signals S1 to S3 are entirely at the low level, and accordingly, all of the precharge wires LA and LC and the discharge wires LB and LD are precharged to the high level. Moreover, the hit signal HIT is also fixed at the low level.

Here, when the address (composed of n bits formed of the bit signals A1 to An) to which the access is requested is changed at time t0, and further, the timing signals S1 and S2 are changed to the high level at time t1 and time t2, respectively, the transistor 43 turns on, and accordingly, a potential of the discharge wire LB is changed to the low level. In this case, if the outputs F1 to Fn from the storage circuits FL1 to FLn and the corresponding bit signals A1 to An match with each other "entirely", then the hit signals OUT1 to OUTn drop to the low level "entirely".

Further, the enable signal SE is in the low level because the enable fuse is cut. When this described condition is established, the transistors provided between the precharge wire LA and the discharge wire LB entirely turn to the OFF state, and accordingly, the potential of the precharge wire LA is not changed to the low level, and the precharge state thereof at the high level will be maintained. Thus, the transistor 52 is maintained in the ON state.

Then, when the timing signal S3 is changed to the high level at time t3, since the transistor 53 also turns on, an input terminal of the latch circuit 54 is connected to the ground potential GND through the transistors 52 and 53. Thus, the hit signal HIT as an output is changed to the high level, and the notice on the HIT is issued.

The above is the operation of the fuse circuits 11 and 12 when the HIT is detected in the used state (a state where the enable fuse is cut).

Figure 6:
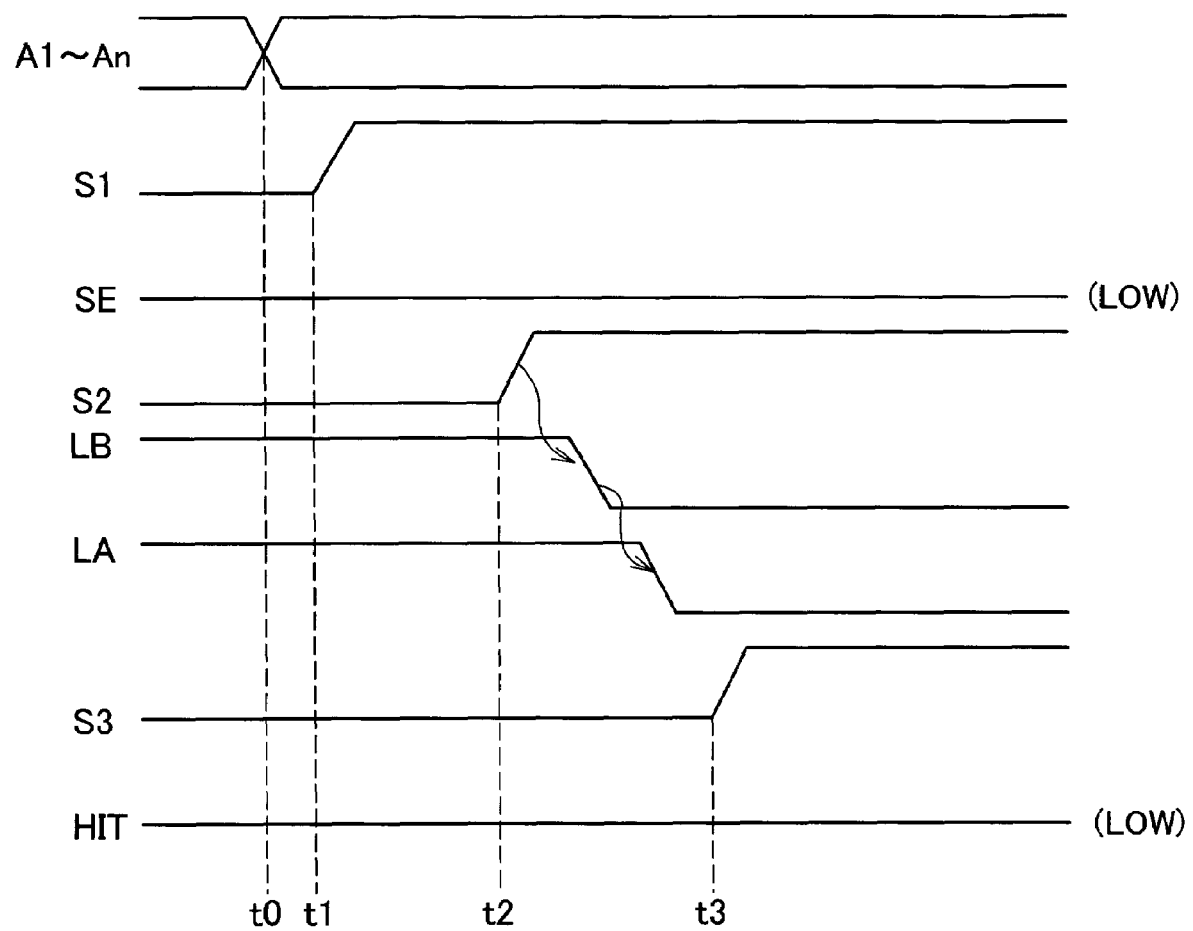
FIG. 6 is a timing chart showing an operation of the fuse circuit when the HIT is not detected in the used state (a state where the enable fuse is cut)

FIG. 6 is a timing chart showing an operation of the fuse circuits 11 and 12 when the HIT is not detected in the used state (a state where the enable fuse is cut).

An operation until time t2 is the same as the operation shown in the timing chart of FIG. 5. However, an operation after the timing S2 is changed to the high level at time t2 and the potential of the discharge wire LB is changed to the low level in response to the above-described change is different from the operation shown in the timing chart of FIG. 5.

Specifically, the case where the HIT is not detected means that the outputs F1 to Fn from the storage circuits FL1 to FLn and the corresponding bit signals A1 to An do not match with each other at least a part thereof, and accordingly, at least one of the hit signals OUT1 to OUTn rises to the high level. Accordingly, since at least one of the discharge transistors Tr1 to Trn turns to the ON state, the potential of the precharge wire LA is changed to the low level, and the transistor 52 turns to the OFF state.

Hence, even if the timing signal S3 is changed to the high level at time t3, the hit signal HIT as the output of the latch circuit 54 is maintained at the low level. Specifically, a notice on MISHIT is issued.

The above is the operation of the fuse circuits 11 and 12 when the HIT is not detected in the used state (a state where the enable fuse is cut).

Figure 7:
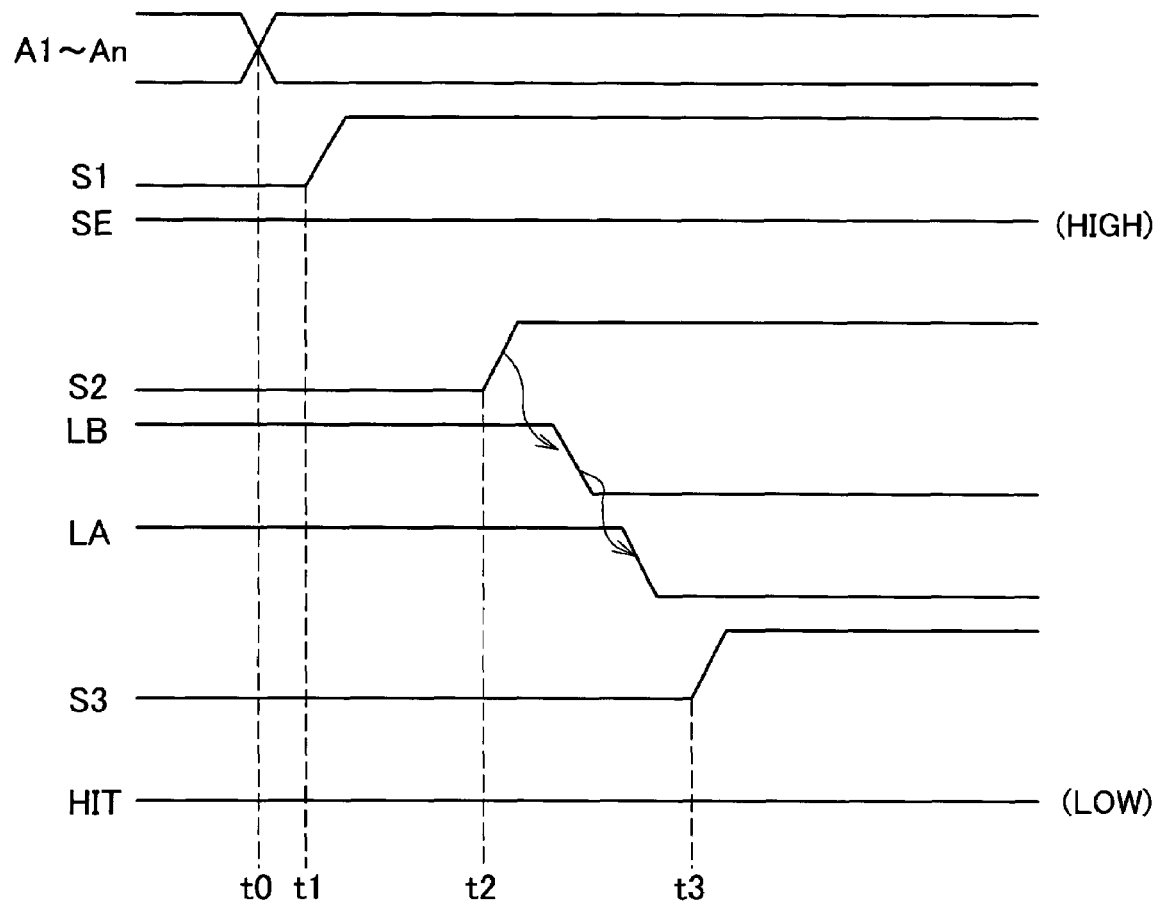
FIG. 7 is a timing chart showing an operation of the fuse circuit in the unused state (a state where the enable fuse is uncut)

FIG. 7 is a timing chart showing an operation of the fuse circuits 11 and 12 in the unused state (a state where the enable fuse is uncut).

When the enable fuse is in an uncut state, the enable signal SE is maintained at the high level. Thus, since the enable transistor TrE is being in the ON state, the timing signal S2 is changed to be at the high level at time t2. When the potential of the extraction wire LB is thus changed to be at the low level, the potential of the precharge wire LA is changed to be at the low level without fail irrespective of the ON/OFF of the extraction transistors Tr1 to Trn.

Thus, the transistor 52 takes the OFF state without fail. Accordingly, even if the timing signal S3 is changed to be at the high level at time t3, the hit signal HIT as the output of the latch circuit 54 is maintained at the low level, and the notice on the MISHIT is issued.

The above is the operation in the unused state (a state where the enable fuse is uncut).

Next, a description will be made of a method for deciding the fuse circuit for use in the semiconductor device 10 according to this embodiment.

Figure 8:
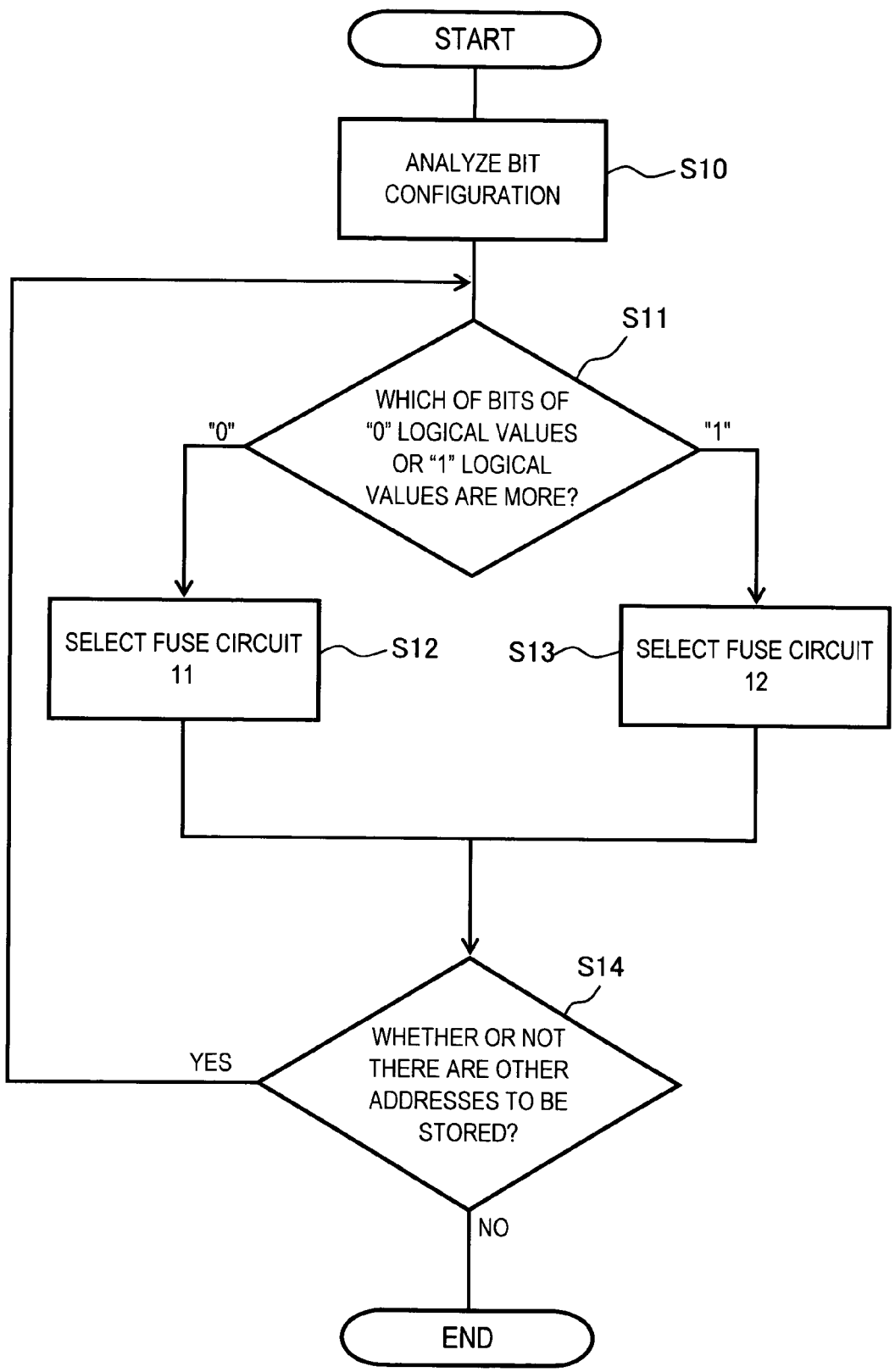
FIG. 8 is a flowchart for explaining a preferable method for deciding the fuse circuit for use in the first embodiment.

FIG. 8 is a flowchart for explaining a preferable method for deciding the fuse circuit for use.

First, a bit configuration of the address desired to be stored is analyzed (Step S10), and it is determined which of the number of bits in which the logical values are "0" and the number of bits in which the logical values are "1" are more (Step S11). As a result, when the number of bits in which the logical values are "0" is larger, the fuse circuit 11 is selected (Step S12), and when the number of bits in which the logical values are "1" is larger, the fuse circuit 12 is selected (Step S13).

Then, it is determined whether or not there are other addresses to be stored (Step S14). When the other addresses to be stored are left (Step S14: YES), this decision processing returns to Step S10. When the other addresses to be stored are not left (Step S14: NO), a series of the processing is ended. Such a series of the processing can also be executed by a software process using a computer based on data obtained by a semiconductor tester, and the like. Then, the fuse cutting apparatus is controlled based on the result obtained by the process concerned.

According to the above-described method, the number of cut program fuses included in the fuse circuits 11 and 12 becomes a half or less (n/2 or less) of the entire number (n) of program fuses without fail. Specifically, the number of program fuses to be cut can be reduced. As a result, it is made possible to further reduce the manufacturing cost of the semiconductor device 10, and in addition, to further enhance the reliability of the semiconductor device 10 as an end product.

Note that, when it is determined in Step S14 that the number of bits in which the logical values are "0" and the number of bits in which the logical values are "1" are equal to each other, either of the fuse circuits 11 and 12 may be selected, and for example, the selection may be determined based on the logical values of the MSB and the LSB. Moreover, when there is no room in the selected one of the fuse circuits 11 and 12 as a result of the determination by Step S14, the other of the fuse circuits 11 and 12 should be selected instead.

As described above, in this embodiment, the fuse circuits 11 each of which detects the match by the exclusive OR circuits EXOR1 to EXORn and the entire inversion fuse circuits 12 each of which detects the match by the exclusive NOR circuits EXNOR1 to EXNORn are mixed. Accordingly, the fuse circuit for use is decided by the method shown in FIG. 8, thus it is made possible to reduce the number of program fuses to be cut.

Note that it is not essential that the number of fuse circuits 11 and the number of entire inversion fuse circuits 12 be equal to each other, and a difference may be provided between the numbers of both. However, in the case of deciding the fuse circuit for use by the method shown in FIG. 8, the numbers of both are set substantially equal to each other, thus making it possible to reduce a possibility that there will be no room in either of the fuse circuit 11 and the entire inversion fuse circuit 12.

Next, a second embodiment of the present invention will be described.

Figure 9:
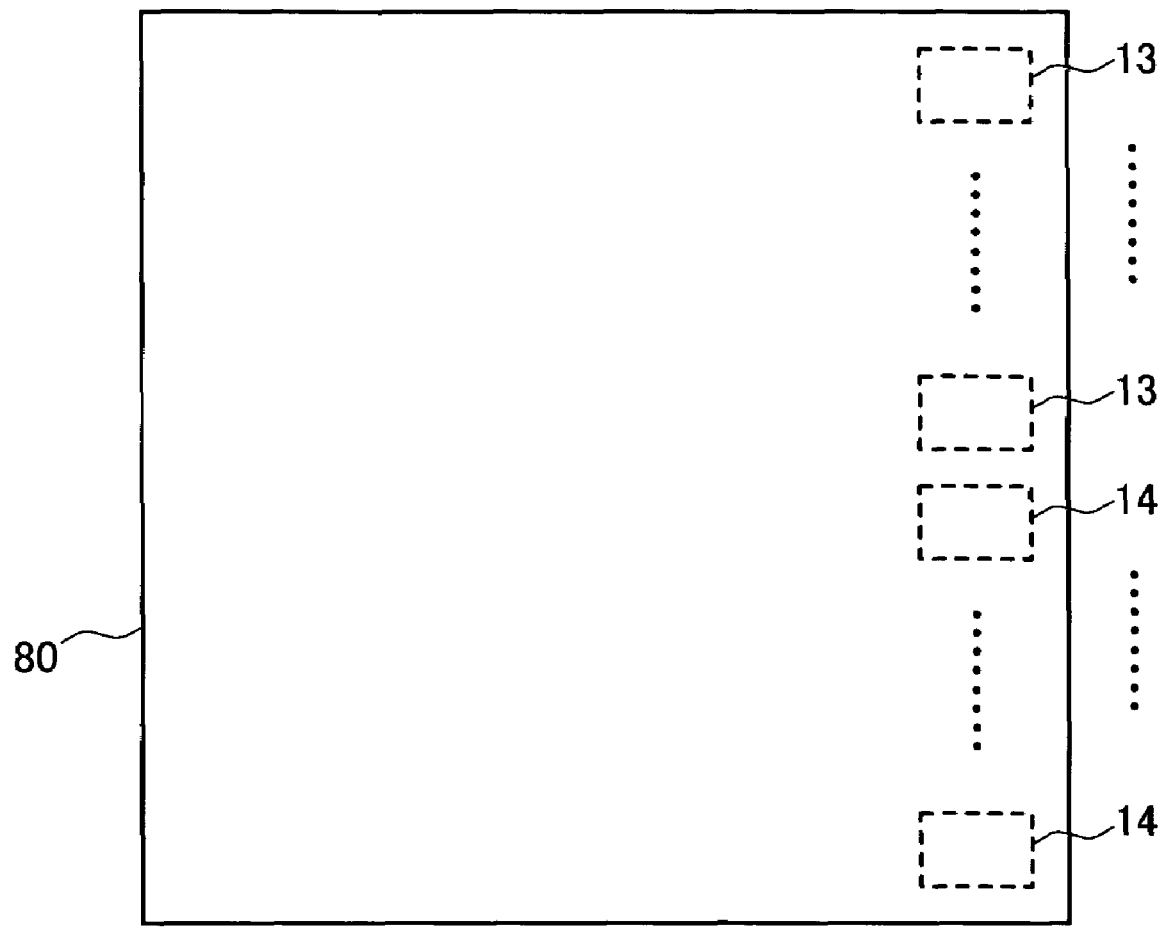
FIG. 9 is a plan view schematically showing a configuration of a semiconductor device according to the second embodiment of the present invention.

FIG. 9 is a plan view schematically showing a configuration of a semiconductor device 80 according to the second embodiment of the present invention.

The semiconductor device 80 according to this embodiment includes the plurality of fuse circuits 13 and a plurality of entire inversion fuse circuits 14, as well as a main circuit (not shown). The fuse circuits 13 and the entire inversion fuse circuits 14 are provided by the same number.

Figure 10:
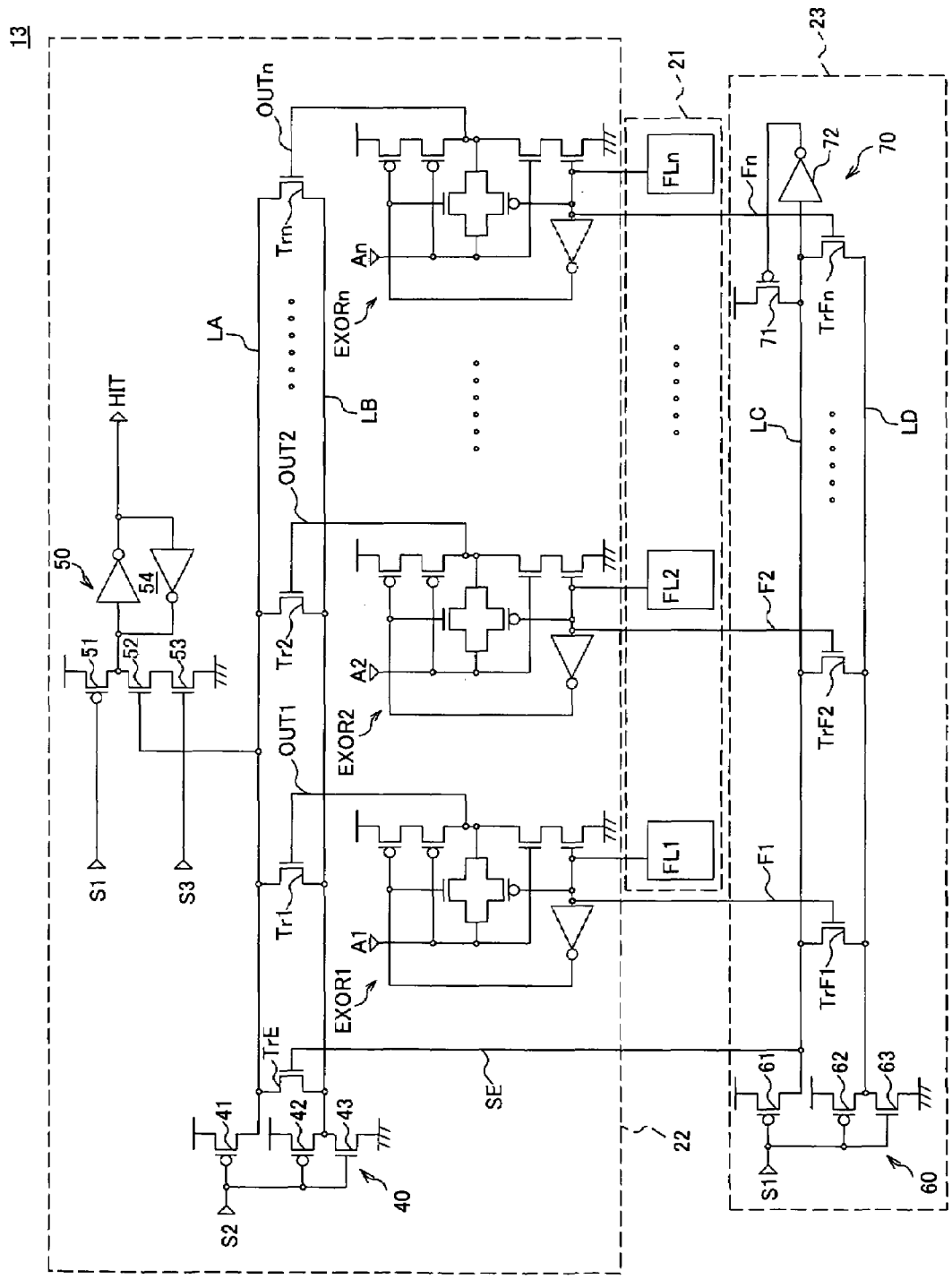
FIG. 10 is a circuit diagram of the fuse circuit shown in FIG. 9.

FIG. 10 is a circuit diagram of the fuse circuit 13.

The fuse circuit 13 shown in FIG. 10 has a configuration in which the enable circuit 24 included in the fuse circuit 11 is replaced by a use determination unit 23. Other configurations are the same as those of the fuse circuit 11. Accordingly, the same reference numerals and symbols are assigned to the same constituents, and a duplicate description will be omitted.

As shown in FIG. 2, the use determination unit 23 includes a precharge circuit 60 which charges a precharge wire LC and a discharge wire LD in response to the timing signal S1, discharge transistors TrF1 to TrFn provided in parallel between the precharge wire LC and the discharge wire LD, and a bias circuit 70 connected to the precharge wire LC. A potential of the precharge wire LC is directly used as the enable signal SE. A specific description will be made below of configurations of the respective components included in the use determination unit 23.

First, the precharge circuit 60 has a similar configuration to that of the precharge circuit 40 included in the hit detection unit 22. Specifically, the precharge circuit 60 is composed of P-channel MOS transistors 61 and 62 and an N-channel MOS transistor 63, a drain of the transistor 61 is connected to the precharge wire LC, and a junction point between the transistors 62 and 63 is connected to the discharge wire LD. However, to gate electrodes of the respective transistors 61 to 63, not the timing signal S2 but the timing signal S1 is commonly supplied. Accordingly, when the timing signal S1 drops to the low level, both of the precharge wire LC and the discharge wire LD are charged up to the power supply potential VDD, and when the timing signal S1 rises to the high level, the discharge wire LD is connected to the ground potential GND.

As described above, the discharge transistors TrF1 to TrFn are provided in parallel between the precharge wire LC and the discharge wire LD. To gate electrodes of the discharge transistors TrF1 to TrFn, the outputs F1 to Fn from the storage circuits FL1 to FLn are supplied, respectively. Hence, when at least one of the outputs F1 to Fn from the storage circuits FL1 to FLn is at the high level, that is, when at least one of the program fuses 31 (refer to FIG. 3) included in the storage circuits FL1 to FLn is cut, the precharge wire LC and the discharge wire LD are always brought into an short-circuited state. On the contrary, when the outputs F1 to Fn from the storage circuits FL1 to FLn are entirely at the low level, that is, when the program fuses 31 (refer to FIG. 3) included in the storage circuits FL1 to FLn are entirely uncut, the precharge wire LC and the discharge wire LD will not be short-circuited.

The bias circuit 70 is composed of a P-channel MOS transistor 71 connected between the power supply potential VDD and the precharge wire LC, and an inverter 72 having an input terminal connected to the precharge wire LC and an output terminal connected to a gate electrode of the transistor 71.

With such a configuration, when the program fuses 31 (refer to FIG. 3) included in the storage circuits FL1 to FLn are entirely uncut, a precharge state (high level) of the precharge wire LC will be surely maintained. Accordingly, even if noise and the like enter the bias circuit 70 from the outside, the determination signal is not erroneously changed to the low level, and is always maintained at the high level. It is at the low level that the enable signal SE is brought into an active state, and as will be described later, when the enable signal SE is changed to the low level, the hit detection unit 22 is activated.

The above is a specific circuit configuration of the fuse circuit 13. Next, a description will be made of a specific configuration of each entire inversion fuse circuits 14.

Figure 11:
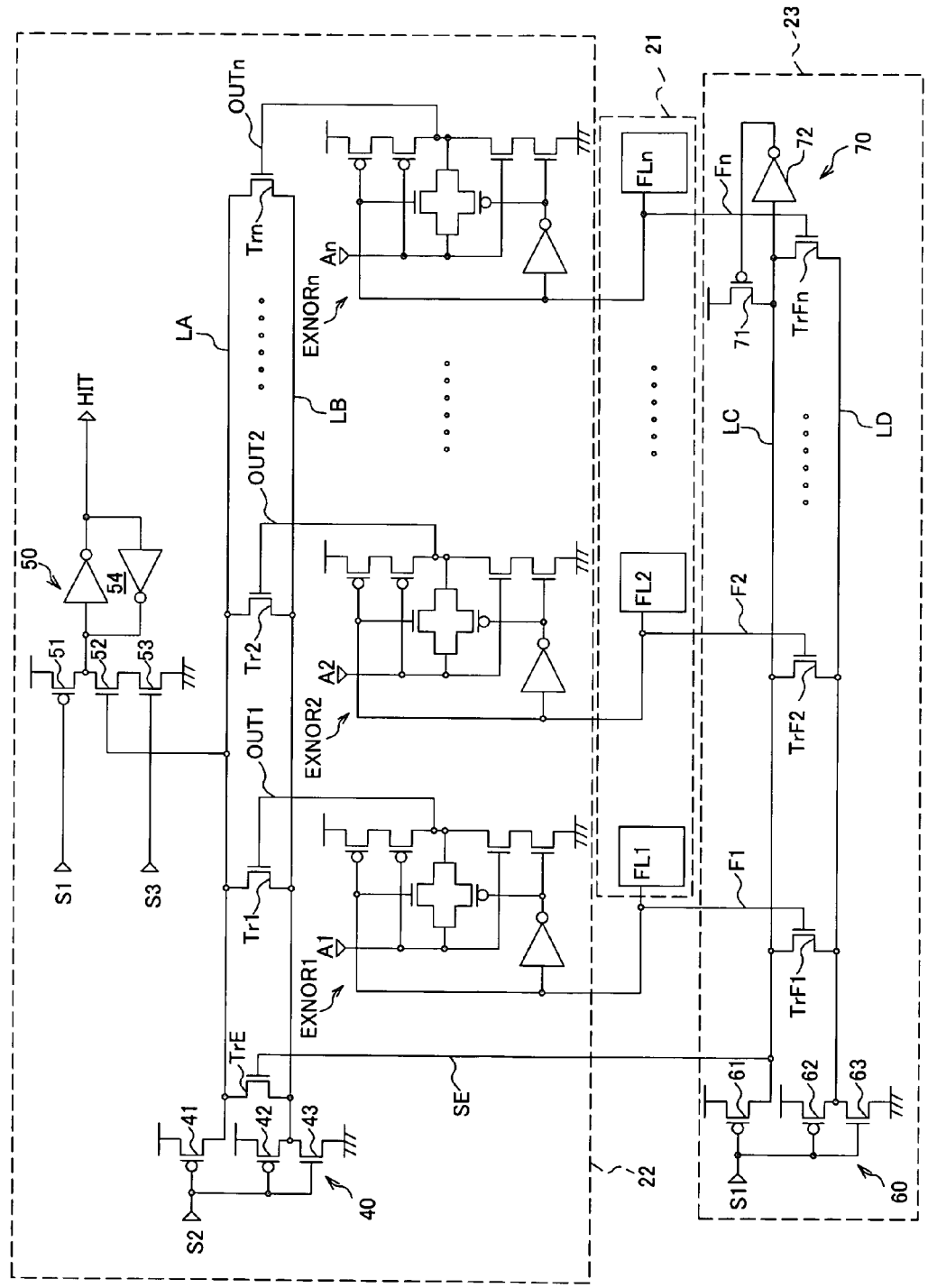
FIG. 11 is a circuit diagram of the entire inversion fuse circuit shown in FIG. 9.

FIG. 11 is a circuit diagram of the entire inversion fuse circuit 14.

As shown in FIG. 11, the entire inversion fuse circuit 14 has a configuration in which the enable circuit 24 included in the entire inversion fuse circuit 12 is replaced by a use determination unit 23. Other configurations are the same as those of the entire inversion fuse circuit 12. Accordingly, the same reference numerals and symbols are assigned to the same constituents, and a duplicate description will be omitted.

In the case of allowing the entire inversion fuse circuit 14 to store the desired address, it is necessary to allow the entire inversion fuse circuit 14 to store the logical values of the respective bits constituting the address concerned while entirely inverting the logical values concerned. The configuration of the use determination unit 23 is the same as that of the use determination unit 23 included in the fuse circuit 13.

As described above, in the fuse circuits 13 and 14 for use in this embodiment, the enable signal SE is generated by the use determination unit 23. As apparent from the above description, the enable signal SE is activated (SE=low level) by the short circuit of the precharge wire LC and the extraction wire LD when at least one of the program fuses 31 included in the storage circuits FL1 to FLn is cut. On the contrary, when the program fuses 31 included in the storage circuits FL1 to FLn are entirely uncut, such a non-active state is maintained (SE=high level).

Here, the "state where at least one of the program fuses 31 included in the storage circuits FL1 to FLn is cut" means that the fuse circuits 13 and 14 concerned are in a used state (a state where the HIT detecting operation is performed), and the "state where the program fuses 31 included in the storage circuits FL1 to FLn are entirely uncut" means that the fuse circuits 13 and 14 concerned are in an unused state (a state where the HIT detecting operation is not performed). As described above, it is determined whether the fuse circuits 13 and 14 are in the used state or in the unused state depending not on whether or not the enable fuse is cut but on whether or not the program fuse 31 itself is cut.

As described foregoing, the fuse circuit 13 and the entire inversion fuse circuit 14 are configured to be capable of storing addresses different from each other based on a same cutting pattern of the plural program fuses.

Next, operations of the fuse circuits 13 and 14 will be described in more detail while referring to timing charts of FIG. 12 to FIG. 14.

Figure 12:
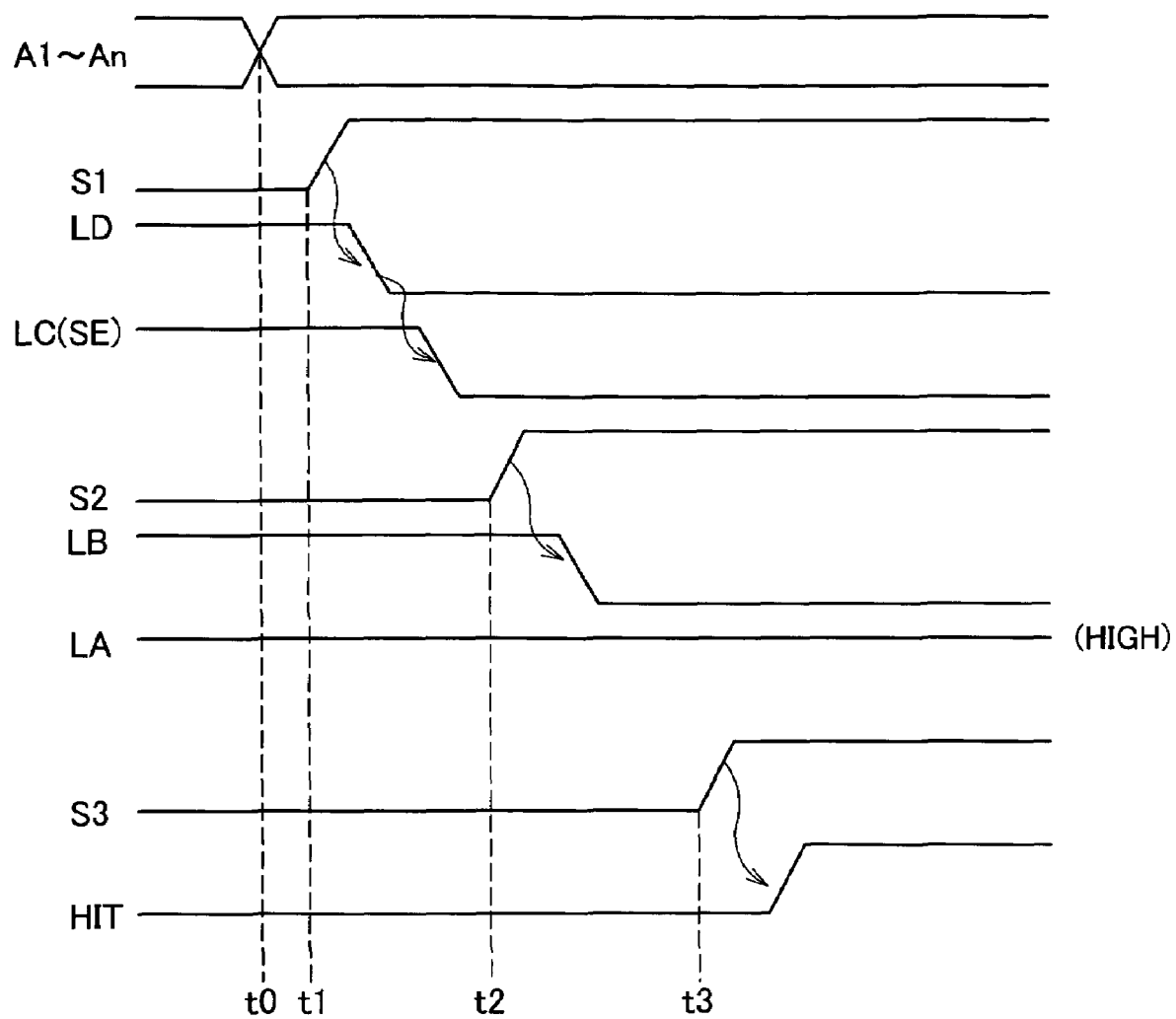
FIG. 12 is a timing chart showing an operation of the fuse circuit when the HIT is detected in the used state (a state where the HIT detecting operation is performed)

FIG. 12 is a timing chart showing an operation of the fuse circuits 13 and 14 when the HIT is detected in the used state (a state where the HIT detecting operation is performed).

First, in an initial state, the timing signals S1 to S3 are entirely at the low level, and accordingly, all of the precharge wires LA and LC and the discharge wires LB and LD are precharged to the high level. Moreover, the hit signal HIT is also fixed at the low level.

Here, when the address (composed of n bits formed of the bit signals A1 to An) to which the access is requested is changed at time t0, and further, the timing signal S1 is changed to the high level at time t1, the transistor 63 turns on, and accordingly, a potential of the discharge wire LD is changed to the low level. Moreover, in the used state (a state where the HIT detecting operation is performed), since at least one of the program fuses 31 included in the storage circuits FL1 to FLn is cut, at least one of the discharge transistors TrF1 to TrFn must be turning on.

Therefore, a potential of the precharge wire LC is also changed to the low level. The potential of the precharge wire LC is directly used as the enable signal SE, and is supplied to the gate electrode of the enable transistor TrE. Accordingly, the enable transistor TrE turns to an OFF state. That is, the hit detection unit 22 is brought into an activated state.

Next, when the timing signal S2 is changed to the high level at time t2, the transistor 43 turns on, and accordingly, the potential of the discharge wire LB is changed to the low level. In this case, if the outputs F1 to Fn from the storage circuits FL1 to FLn and the corresponding bit signals A1 to An match with each other "entirely", then the hit signals OUT1 to OUTn drop to the low level "entirely".

When this described condition is established, the transistors provided between the precharge wire LA and the discharge wire LB entirely turn to the OFF state, and accordingly, the potential of the precharge wire LA is not changed to the low level, and the precharge state thereof at the high level will be maintained. Thus, the transistor 52 is maintained in the ON state.

Then, when the timing signal S3 is changed to the high level at time t3, since the transistor 53 also turns on, an input terminal of the latch circuit 54 is connected to the ground potential GND through the transistors 52 and 53. Thus, the hit signal HIT as an output is changed to the high level, and the notice on the HIT is issued.

The above is the operation of the fuse circuits 13 and 14 when the HIT is detected in the used state (a state where the HIT detecting operation is performed).

Figure 13:
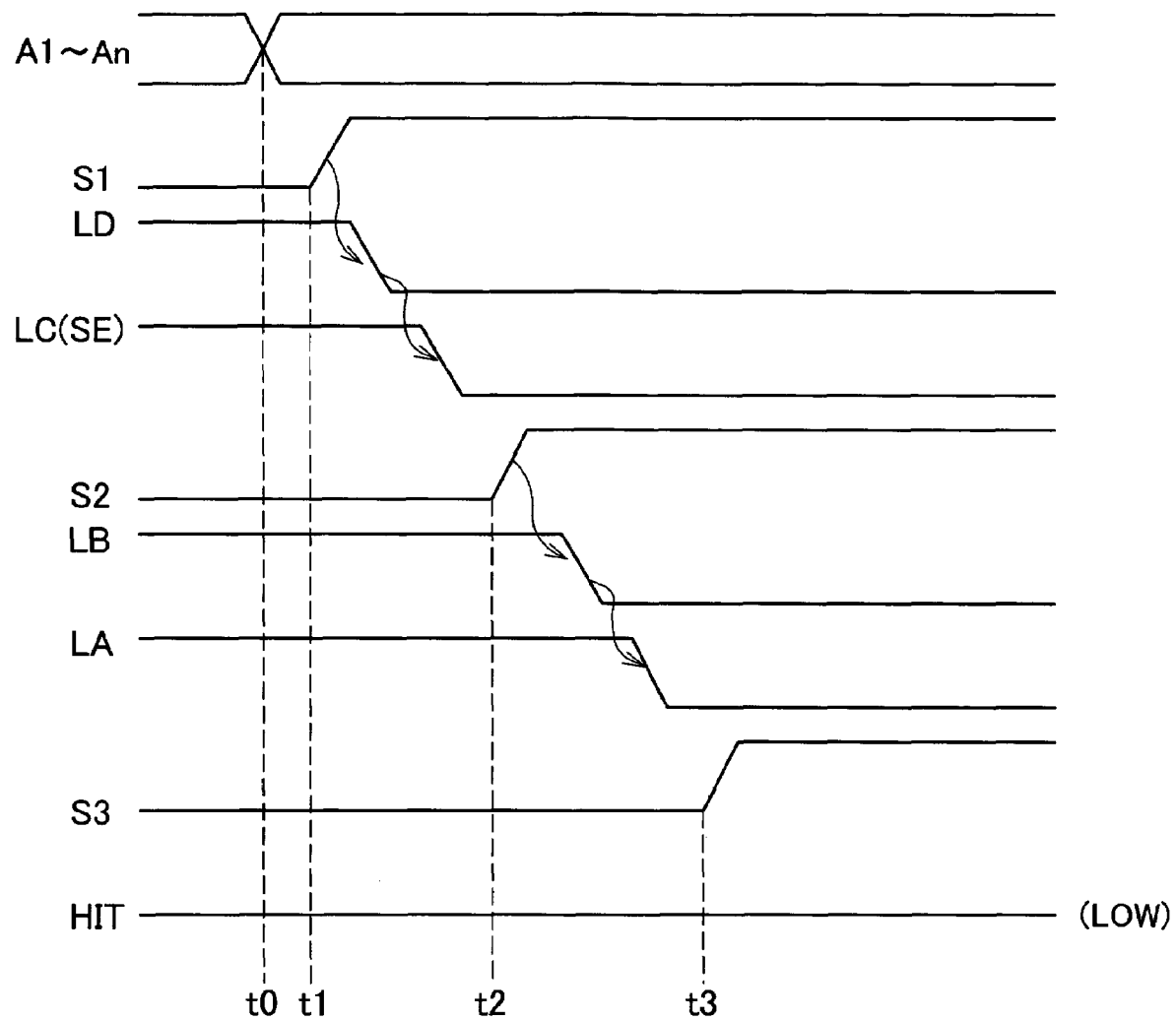
FIG. 13 is a timing chart showing an operation of the fuse circuit when the HIT is not detected in the used state (a state where the HIT detecting operation is performed)

FIG. 13 is a timing chart showing an operation of the fuse circuits 13 and 14 when the HIT is not detected in the used state (a state where the HIT detecting operation is performed).

An operation until time t2 is the same as the operation shown in the timing chart of FIG. 12. However, an operation after the timing S2 is changed to the high level at time t2 and the potential of the discharge wire LB is changed to the low level in response to the above-described change is different from the operation shown in the timing chart of FIG. 12.

Specifically, the case where the HIT is not detected means that the outputs F1 to Fn from the storage circuits FL1 to FLn and the corresponding bit signals A1 to An do not match with each other at least a part thereof, and accordingly, at least one of the hit signals OUT1 to OUTn rises to the high level. Accordingly, since at least one of the discharge transistors Tr1 to Trn turns to the ON state, the potential of the precharge wire LA is changed to the low level, and the transistor 52 turns to the OFF state.

Hence, even if the timing signal S3 is changed to the high level at time t3, the hit signal HIT as the output of the latch circuit 54 is maintained at the low level. Specifically, a notice on MISHIT is issued.

The above is the operation of the fuse circuits 13 and 14 when the HIT is not detected in the used state (a state where the HIT detecting operation is performed).

Figure 14:
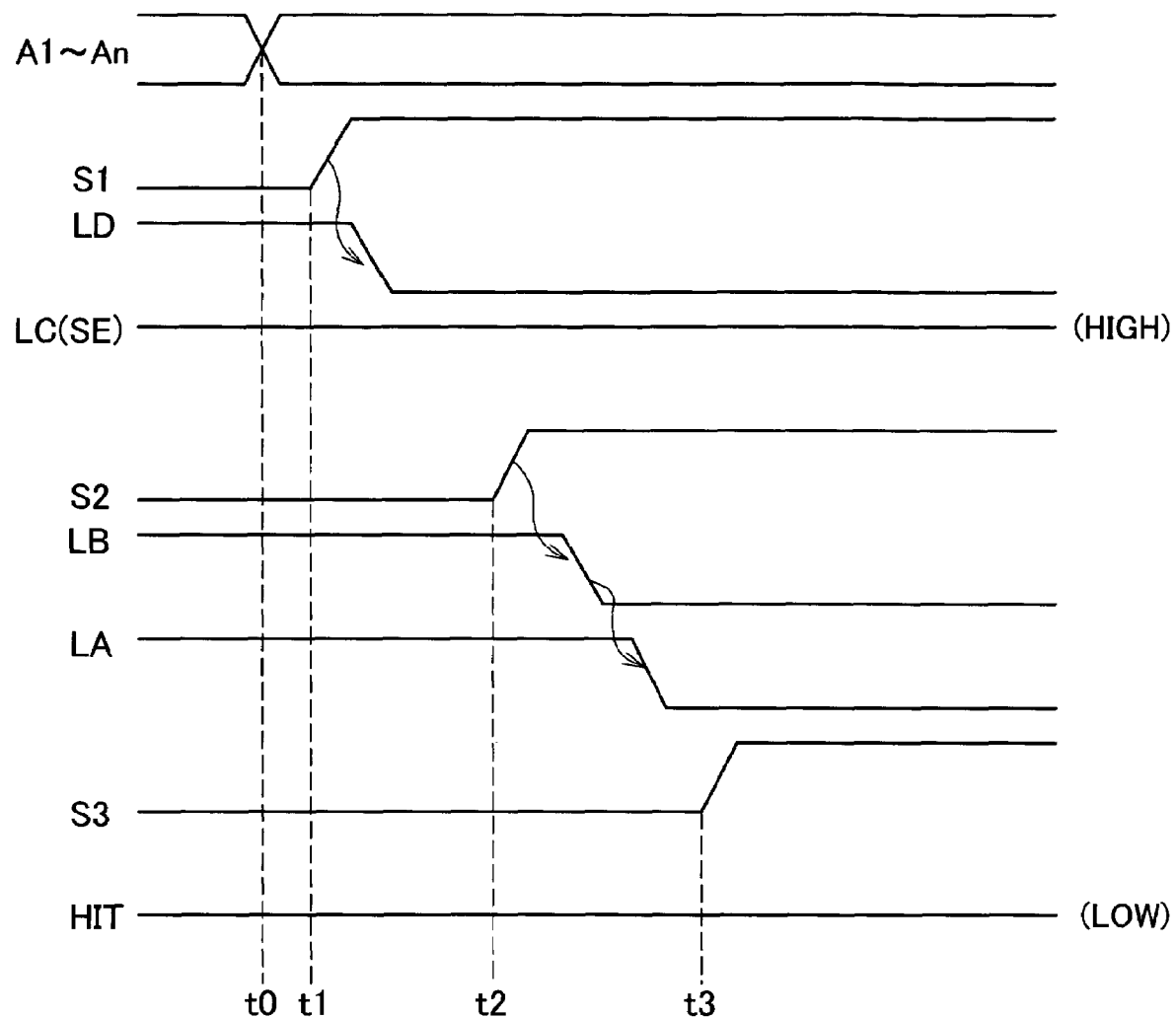
FIG. 14 is a timing chart showing an operation of the fuse circuit in the unused state (a state where the HIT detecting operation is not performed)

FIG. 14 is a timing chart showing an operation of the fuse circuits 13 and 14 in the unused state (a state where the HIT detecting operation is not performed).

An operation until time t1 is the same as the operations shown in the timing charts of FIG. 12 and FIG. 13; however, an operation after the timing signal S1 is changed to the high level at time t1 is different therefrom. Specifically, even if the potential of the discharge wire LD is changed to the low level in response to the change of the timing signal S1 to the high level, the program fuses 31 included in the storage circuits FL1 to FLn are entirely uncut in the unused state (a state where the HIT detecting operation is not performed), and accordingly, the discharge transistors TrF1 to TrFn are entirely in the OFF state.

Therefore, the potential of the precharge wire LC is not changed to the low level, and the enable signal SE as the potential of the precharge wire LC is maintained at the high level. Thus, the enable transistor TrE turns to the ON state, and the hit detection unit 22 is inactivated.

As described above, in the unused state (a state where the HIT detecting operation is not performed), the enable transistor TrE has turned to the ON state before the timing signal S2 is changed to the high level, and accordingly, the timing signal S2 is changed to the high level at time t2, and the potential of the discharge wire LB is thus changed to the low level. Then, the potential of the precharge wire LA is changed to the low level without fail irrespective of the ON/OFF of the discharge transistors Tr1 to Trn.

Thus, the transistor 52 turns to the OFF state without fail. Accordingly, even if the timing signal S3 is changed to the high level at time t3, the hit signal HIT as the output of the latch circuit 54 is maintained at the low level, and the notice on the MISHIT is issued.

The above is the operation of the fuse circuits 13 and 14 in the unused state (a state where the HIT detecting operation is not performed).

As described above, without using the enable fuse, it can be determined whether the fuse circuits 13 and 14 is in the used state (a state where the HIT detecting operation is performed) or in the unused state (a state where the HIT detecting operation is not performed). Then, in the used state, the HIT of a desired address stored based on a cutting pattern of the plural program fuses 31 can be detected, and in the unused state, the hit signal HIT can be surely prohibited from being activated.

Accordingly, not only it is made possible to reduce the number of fuse elements by one as compared with the fuse circuits 11 and 12 shown in FIG. 2 and FIG. 4, but also it is made unnecessary to cut the enable fuse like the fuse circuits 11 and 12. Therefore, as a whole, it is made possible to reduce the number of fuse elements to be cut.

Note that, while the use determination unit 23 is provided instead of the enable fuse in the fuse circuits 13 and 14, a circuit area occupied by the use determination circuit 23 is substantially equivalent to an area occupied by one fuse element or less according to the current circuit integration technology. In addition, while it is extremely difficult to miniaturize the fuse element since it is necessary to physically cut the fuse element concerned, it can be expected that the use determination unit 23 will be further miniaturized in the future owing to a progress of the circuit integration technology since the use determination unit 23 is an aggregate of the transistors.

However, when the program fuses 31 included in the storage circuits FL1 to FLn are entirely in the uncut state, the fuse circuit 13 is automatically regarded as in the "unused state". Accordingly, the fuse circuit 13 cannot perform the HIT detection for a specific address stored by leaving the entire program fuses 31 uncut, that is, the address in which the logical values of the entire bits are "0". Because of a similar reason, the entire inversion fuse circuit 14 cannot perform the HIT detection for the address in which the logical values of the entire bits are "1". Hence, in the case of deciding the fuse circuit for use, it is necessary to consider the above-described point.

Figure 15:
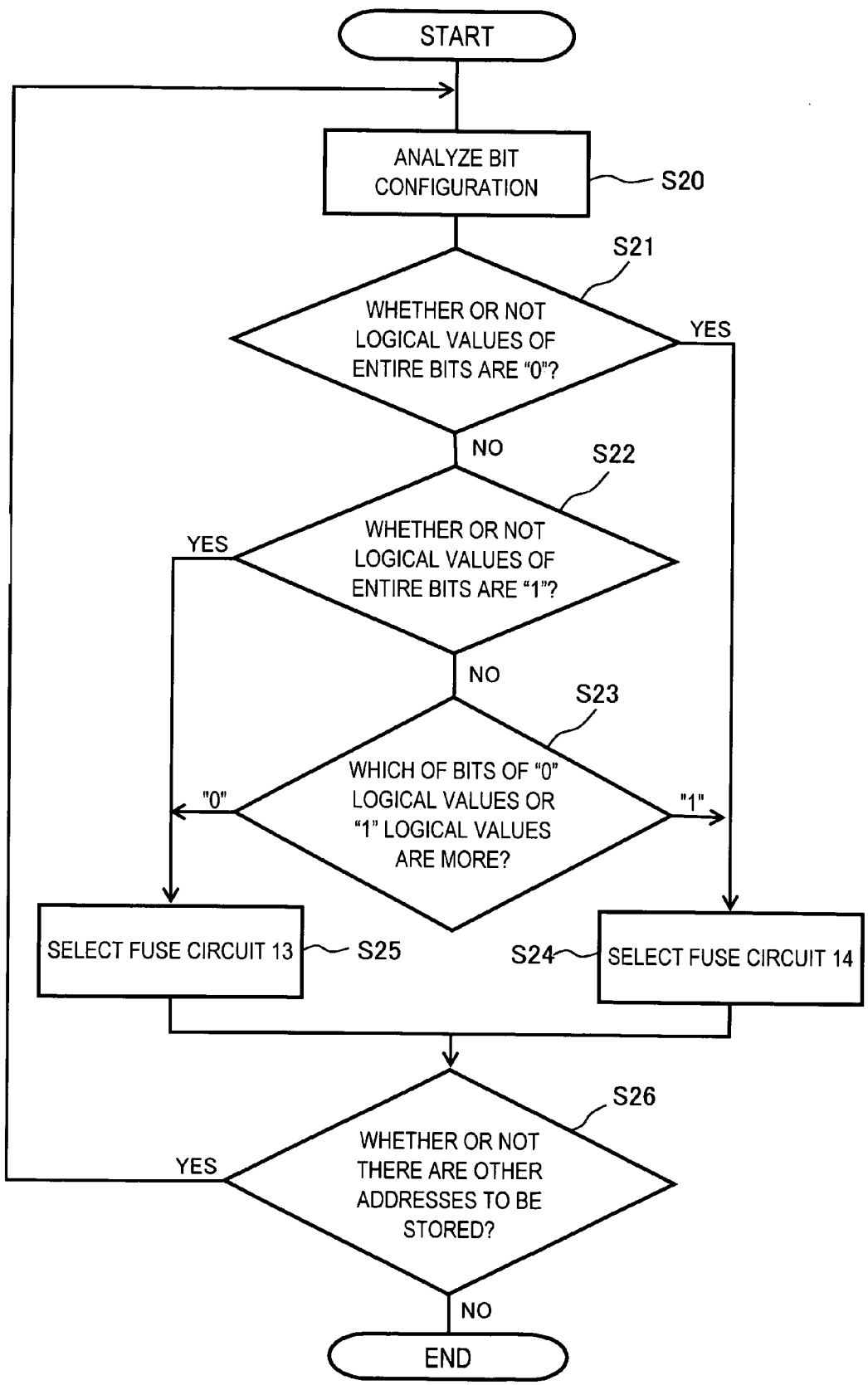
FIG. 15 is a flowchart for explaining a preferable method for deciding the fuse circuit for use in the second embodiment.

FIG. 15 is a flowchart for explaining a preferable method for deciding the fuse circuit for use.

First, a bit configuration of the address desired to be stored is analyzed (Step S20). When the logical values of the entire bits are "0" (Step S21: YES), the entire inversion fuse circuit 14 is selected (Step S24). When the logical values of the entire bits are "1" (Step S22: YES), the fuse circuit 13 is selected (Step S25). Meanwhile, when the logical values of the entire bits are not "0" or "1" (Step S21: NO; Step S22: NO), it is determined which of the bits in which the logical values are "0" and the bits in which the logical values are "1" are more (Step S23).

As a result, when the bits in which the logical values are "0" are more, the fuse circuit 13 is selected (Step S25), and when the bits in which the logical values are "1" are more, the entire inversion fuse circuit 14 is selected (Step S24). Then, it is determined whether or not there are other addressed to be stored (Step S26). When the other addresses to be stored are left (Step S26: YES), this decision processing returns to Step S20. When the other addresses to be stored are not left (Step S26: NO), a series of the processing is ended. Such a series of the processing can also be executed by the software process of the computer, and the fuse cutting apparatus is controlled based on the result obtained by the process concerned.

According to the above-described method, the number of cut program fuses included in the storage circuit group 21 becomes a half or less (n/2 or less) of the entire number (n) of program fuses without fail except in the case where the logical values of the entire bits are "0" or "1". Specifically, the number of cut program fuses can be reduced. As a result, it is made possible to further reduce the manufacturing cost of the semiconductor device 80, and in addition, to further enhance the reliability of the semiconductor device 80 as an end product.

Note that, when it is determined in Step S23 that the number of bits in which the logical values are "0" and the number of bits in which the logical values are "1" are equal to each other, either of the fuse circuit 13 and the entire inversion fuse circuit 14 may be selected, and for example, the selection may be determined based on the logical values of the MSB or the LSB. Moreover, when there is no room in the selected fuse circuit 13 or entire inversion fuse circuit 14 as a result of the determination by Step S23, the entire inversion fuse circuit 14 or the fuse circuit 13 should be selected instead.

Here, when there is no room in the fuse circuit 13, an address having the bits in which the logical values are "1" more should be preferentially assigned to the entire inversion fuse circuit 14. When there is no room in the entire inversion fuse circuit 14, an address having the bits in which the logical values are "0" more should be preferentially assigned to the fuse circuit 13.

As described above, in this embodiment, the use determination unit 23 is provided instead of the enable circuit 24, and accordingly, it is made possible to further reduce the number of fuse elements to be cut. Thus, the manufacturing cost of the semiconductor device 80 can be further reduced, and in addition, it is made possible to further enhance the reliability of the semiconductor device 80 an end product. Moreover, since the number of fuse elements is also reduced as a whole, it is also made possible to further reduce the chip size.

Note that it is not essential that the number of fuse circuits 13 and the number of entire inversion fuse circuits 14 be equal to each other, and a difference may be provided between the numbers of both. However, in the case of deciding the fuse circuit for use by the method shown in FIG. 15, the numbers of both are set substantially equal to each other, thus making it possible to reduce a possibility that there will be no room in either of the fuse circuit 13 and the entire inversion fuse circuit 14.

Next, a third embodiment of the present invention will be described.

Figure 16:
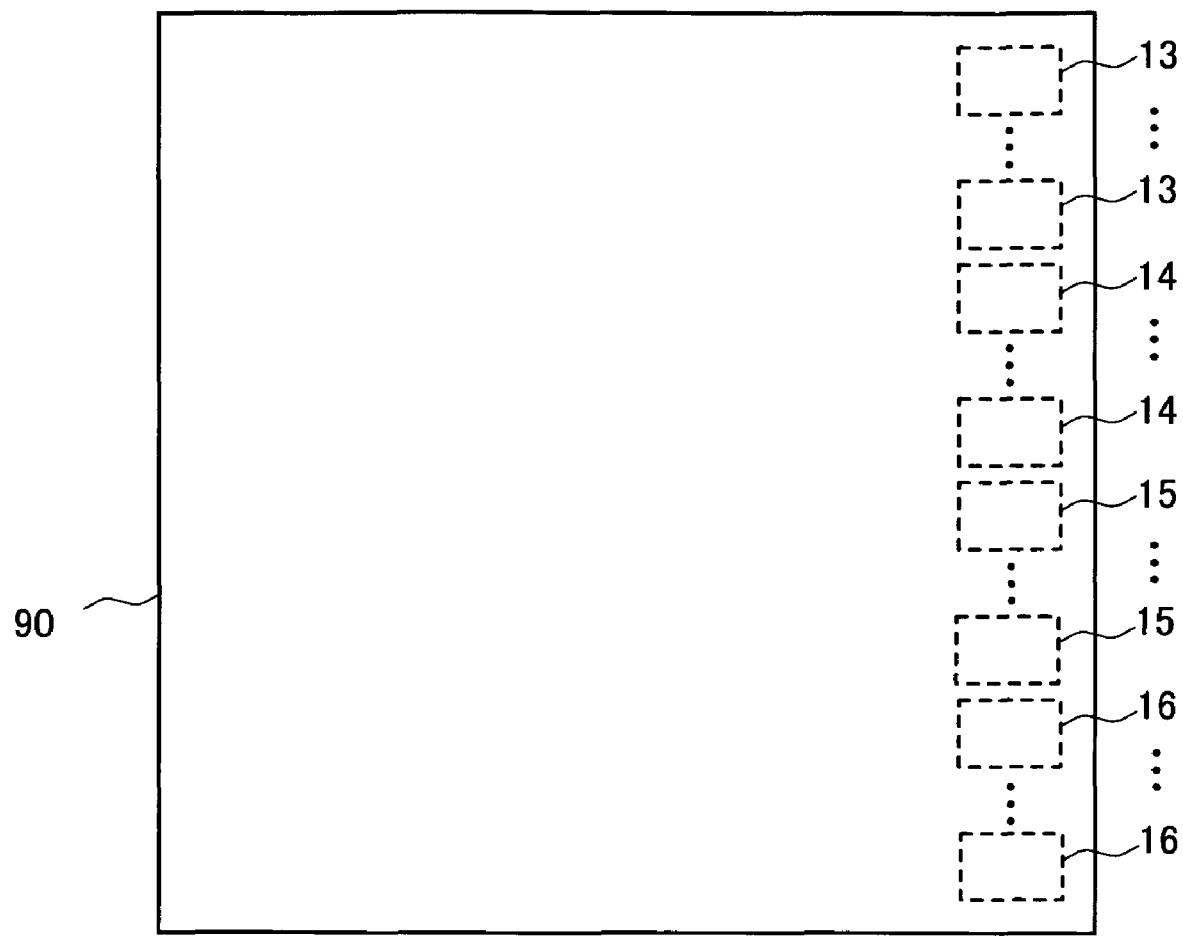
FIG. 16 is a plan view schematically showing a configuration of a semiconductor device according to the third embodiment of the present invention.

FIG. 16 is a plan view schematically showing a configuration of a semiconductor device 90 according to the third embodiment of the present invention.

The semiconductor device 90 according to this embodiment includes the plural fuse circuits 13 (refer to FIG. 10), the plural entire inversion fuse circuits 14 (refer to FIG. 11), plural upper inversion fuse circuits 15, and plural lower inversion fuse circuits 16. The respective fuse circuits 13, 14, 15 and 16 are provided by the same number.

Figure 17:
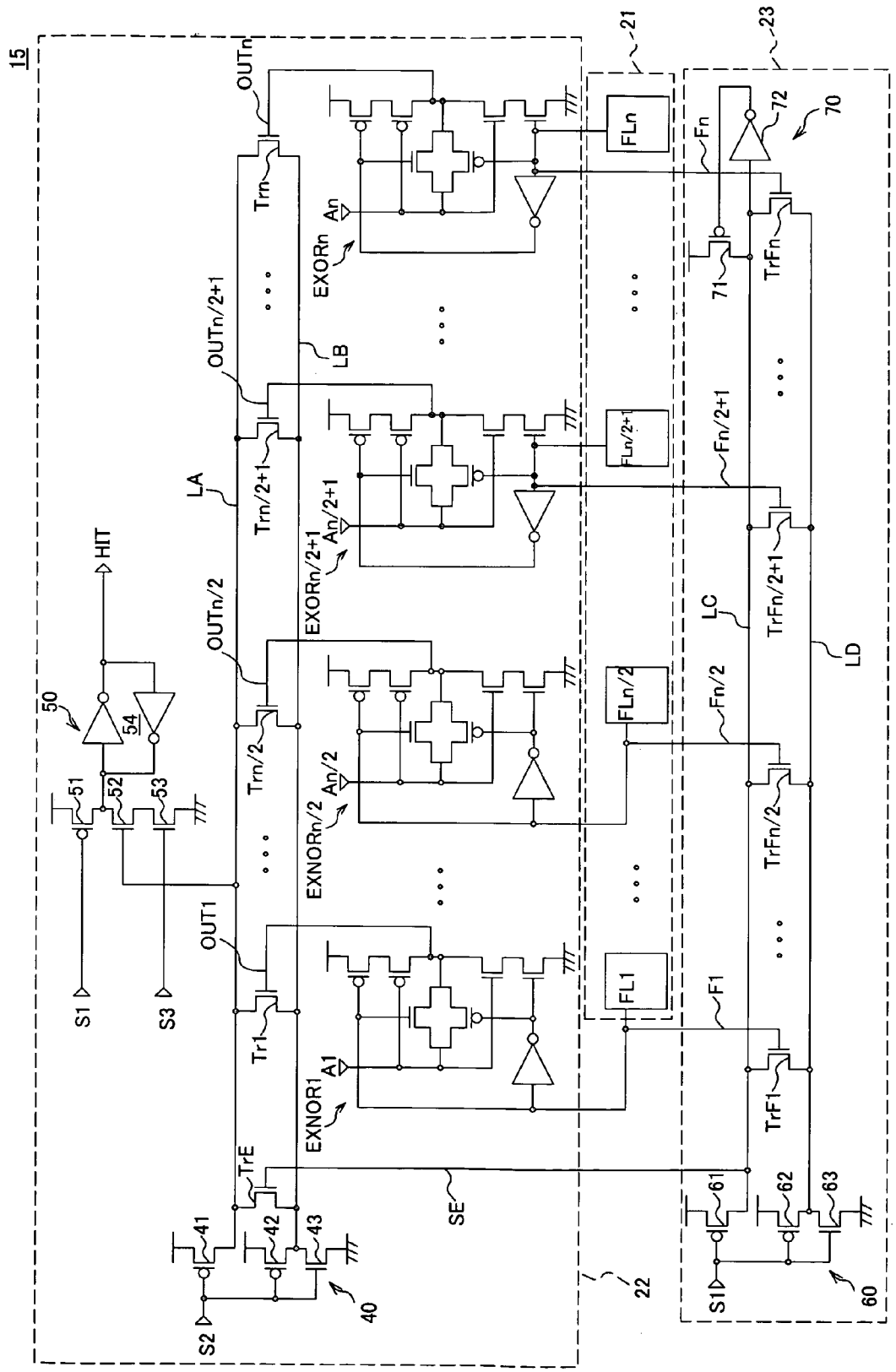
FIG. 17 is a circuit diagram of the upper inversion fuse circuit shown in FIG. 16.
Figure 18:
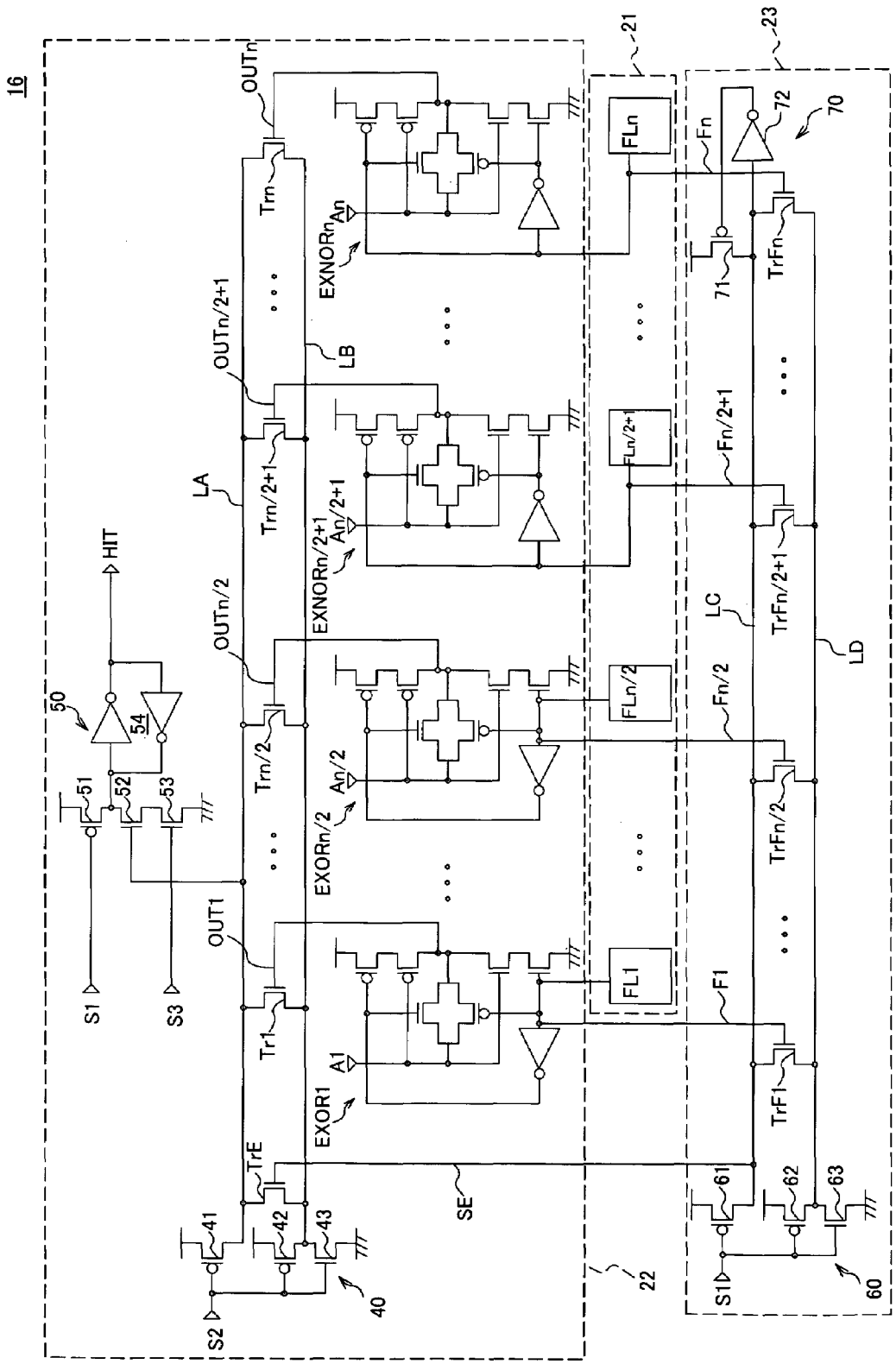
FIG. 18 is a circuit diagram of the lower inversion fuse circuit shown in FIG. 16.

FIG. 17 is a circuit diagram of the upper inversion fuse circuit 15, and FIG. 18 is a circuit diagram of the lower inversion fuse circuit 16.

As shown in FIG. 17 and FIG. 18, each of the upper inversion fuse circuit 15 and the lower inversion fuse circuit 16 has such a circuit configuration in which the fuse circuit 13 and the entire inversion fuse circuit 14 are synthesized. Specifically, as shown in FIG. 17, in the upper inversion fuse circuit 15, the exclusive NOR circuits EXNOR1 to EXNORn are used for upper n/2 bits of the address, and the exclusive OR circuits EXOR1 to EXORn are used for lower n/2 bits of the address.

On the contrary, as shown in FIG. 18, in the lower inversion fuse circuits 16, the exclusive OR circuits EXOR1 to EXORn are used for the upper n/2 bits of the address, and the exclusive NOR circuits EXNOR1 to EXNORn are used for the lower n/2 bits of the address. In each of the fuse circuits, other configurations are the same as those of the fuse circuit 13, and accordingly, the same reference numerals and symbols are assigned to the same constituents, and a duplicate description will be omitted.

In the case of allowing the upper inversion fuse circuit 15 to store a desired address, with regard to the upper n/2 bits constituting the address concerned, it is necessary to store logical values thereof while inverting the logical values concerned. In a similar way, in the case of allowing the lower inversion fuse circuit 16 to store the desired address, with regard to the lower n/2 bits constituting the address concerned, it is necessary to store logical values thereof while inverting the logical values concerned.

As described foregoing, the fuse circuits 13, 14, 15 and 16 are configured to be capable of storing addresses different from one another based on a same cutting pattern of the plural program fuses.

Figure 19A:
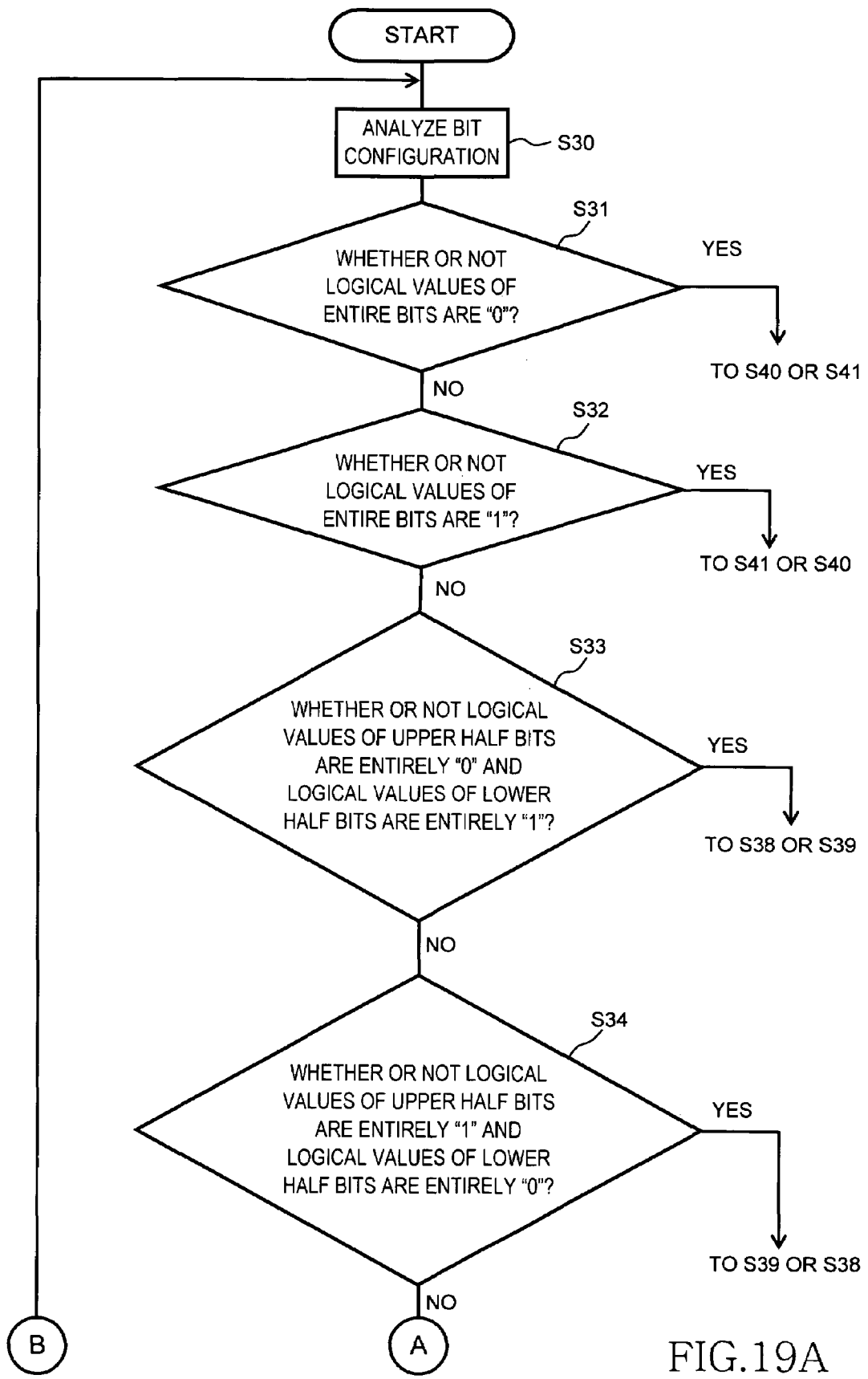
FIGS. 19A and 19B are flowcharts for explaining a preferable method for deciding the fuse circuit for use in the third embodiment.
Figure 19B:
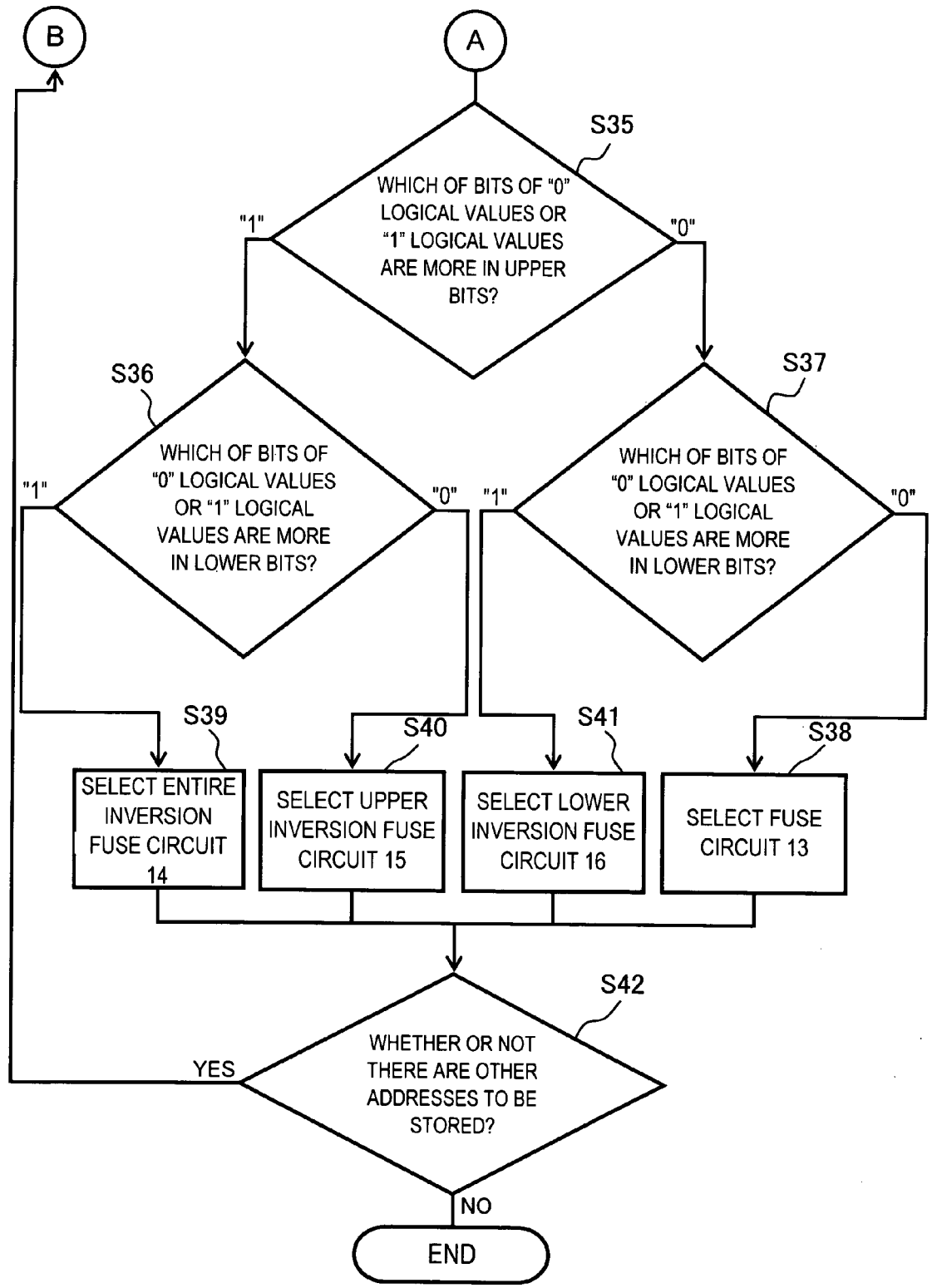

FIGS. 19A and 19B are flowcharts for explaining a preferable method for deciding the fuse circuit for use in this embodiment.

First, a bit configuration of the desired address is analyzed (Step S30). When the logical values of the entire bits are "0" (Step S31: YES), one of the upper inversion fuse circuit 15 and the lower inversion fuse circuit 16 is selected (Step S40 or Step S41). When the logical values of the entire bits are "1" (Step S32: YES), the other of the upper inversion fuse circuit 15 and the lower inversion fuse circuit 16 is selected (Step S41 or Step S40).

Moreover, when the logical values of the upper n/2 bits are entirely "0", and the logical values of the lower n/2 bits are entirely "1" (Step S33: YES), one of the fuse circuit 13 and the entire inversion fuse circuit 14 is selected (Step S38 or Step S39). When the logical values of the upper n/2 bits are entirely "1", and the logical values of the lower n/2 bits are entirely "0" (Step S34: YES), the other of the fuse circuit 13 and the entire inversion fuse circuit 14 is selected (Step S39 or Step S38).

Meanwhile, when the case does not apply to any of the above (Step S31: NO; Step S32: NO; Step S33: NO; Step S34: NO), it is determined which of the bits in which the logical values are "0" and the bits in which the logical values are "1" are more in the upper n/2 bits (Step S35), and moreover, it is determined which of the bits in which the logical values are "0" and the bits in which the logical values are "1" are more in the lower n/2 bits (Step S36, Step S37).

As a result, when the bits in which the logical values are "0" are more in both of the upper n/2 bits and the lower n/2 bits, the fuse circuit 13 is selected (Step S38). When the bits in which the logical values are "1" are more in both of the upper n/2 bits and the lower n/2 bits, the entire inversion fuse circuit 14 is selected (Step S39).

Meanwhile, when the bits in which the logical values are "1" are more in the upper n/2 bits, and the bits in which the logical values are "0" are more in the lower n/2 bits, the upper inversion fuse circuit 15 is selected (Step S40). Moreover, when the bits in which the logical values are "0" are more in the upper n/2 bits, and the bits in which the logical values are "1" are more in the lower n/2 bits, the lower inversion fuse circuit 16 is selected (Step S41).

Then, it is determined whether or not there are other addresses to be stored (Step S42). When the other addresses to be stored are left, this decision processing returns to Step S30. When the other addresses to be stored are not left, a series of the processing is ended. Such a series of the processing can also be executed by the software process of the computer, and the fuse cutting apparatus is controlled based on the result obtained by the process concerned.

According to this embodiment, the number of cut program fuses included in the storage circuit group 21 becomes a half or less (n/2 or less) of the entire number (n) of program fuses without fail in the cases including the case where the logical values of the entire bits are "0" or "1". In addition, except in the case where the logical values of the entire bits are "0" or "1", each of the number of cut program fuses corresponding to the upper n/2 bits and the number of cut program fuses corresponding to the lower n/2 bits becomes a half or less (n/4 or less) of the number of program fuses corresponding to the n/2 bits as described above.

Accordingly, the number of program fuses to be cut can be further reduced as a whole. As a result, it is made possible to further reduce the manufacturing cost of the semiconductor device 90, and in addition, to further enhance the reliability of the semiconductor device 90 as an end product.

Also in this case, when it is determined in Step S35 to Step S37 that the number of bits in which the logical values are "0" and the number of bits in which the logical values are "1" are equal to each other, for example, the selection of the fuse circuit should be determined based on the logical values of the MSB or the LSB. Moreover, when there is no room in the selected fuse circuit as a result of the determination by Steps S35 to S37, another type of fuse circuit should be selected instead.

Specifically, when there is no room in the fuse circuit 13, the address having the bits in which the logical values are "1" more in the upper n/2 bits should be preferentially assigned to the upper inversion fuse circuit 15, and the address having the bits in which the logical values are "1" more in the lower n/2 bits should be preferentially assigned to the lower inversion fuse circuit 16. For the case where there is no room in the other fuse circuits 14 to 16, similar processing should be performed.

Moreover, it is not essential that the numbers of respective fuse circuits 13, 14, 15 and 16 be equal to one another, and a difference may be present between the numbers. However, the above-described numbers are set substantially equal to one another, thus making it possible to reduce the possibility that there will be no room in the selected fuse circuit.

Next, a fourth embodiment of the present invention will be described.

Figure 20:
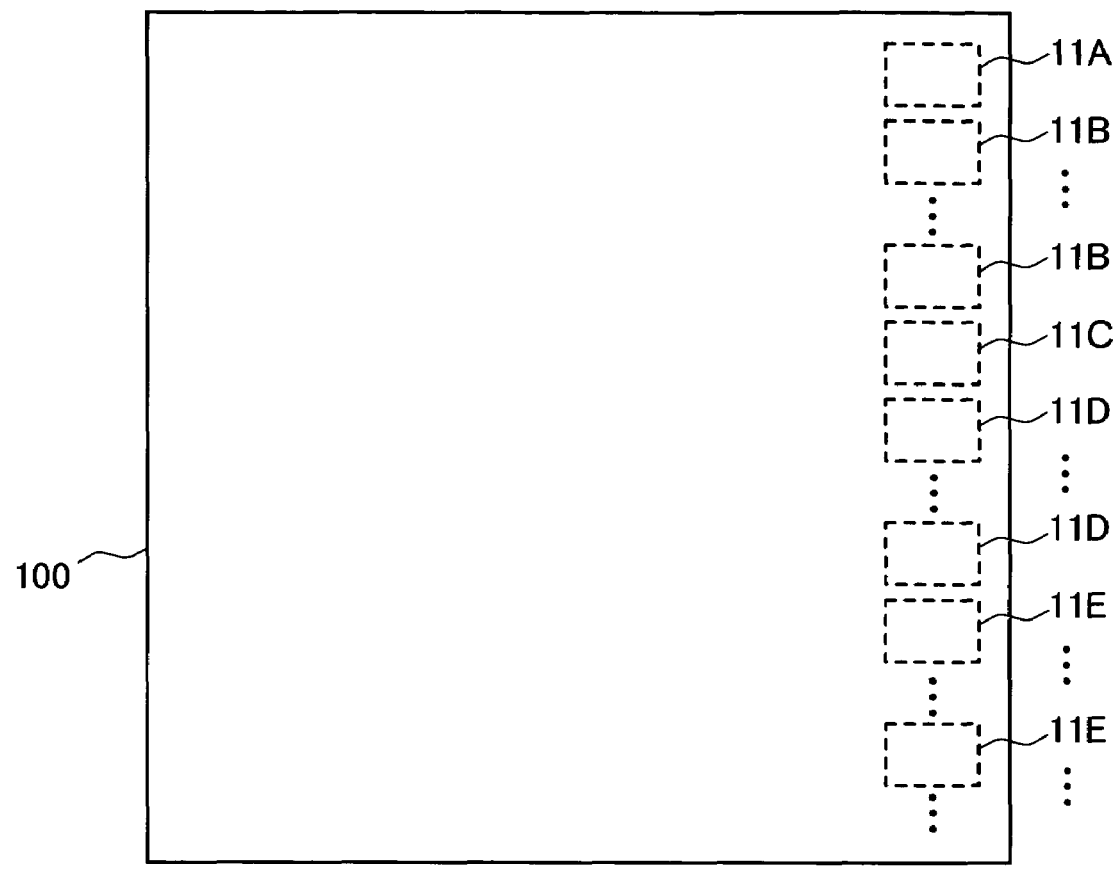
FIG. 20 is a plan view schematically showing a configuration of a semiconductor device according to the fourth embodiment of the present invention.

FIG. 20 is a plan view schematically showing a configuration of a semiconductor device 100 according to the fourth embodiment of the present invention.

The semiconductor device 100 according to this embodiment includes plural types of plural fuse circuits 11A, 11B, 11C, 11D, 11E..., which are the same as the fuse circuit 13, or in which arbitrary exclusive OR circuits EXOR included in the fuse circuit 13 are replaced by the exclusive NOR circuits EXNOR. The types and numbers of these fuse circuits are not particularly limited, and the number of the same type of fuse circuits (for example, fuse circuit 11A) is not limited, either. Hence, the types of the respective fuse circuits may entirely differ from one another, and the same type of fuse circuits may be provided plurality by plurality (for example, four by four).

In this embodiment, configurations of the exclusive OR circuits EXOR and the exclusive NOR circuits EXNOR, which are included in the respective fuse circuits 11A, 11B, 11C, 11D, 11E . . . , are represented by a concept called "mask". Specifically, "0" is assigned as a mask bit to each exclusive OR circuit EXOR, and "1" is assigned as a mask bit to each exclusive NOR circuit EXNOR, thus specifying circuit configurations of the respective fuse circuits 11A, 11B, 11C, 11D, 11E . . . . Hence, a mask of the fuse circuit 13 (refer to FIG. 10), a mask of the entire inversion fuse circuit 14 (refer to FIG. 11), a mask of the upper inversion fuse circuit 15 (refer to FIG. 17), and a mask of the lower inversion fuse circuit 16 (refer to FIG. 18) individually become as shown in Table 1.

TABLE 1

| Circuit configuration | Mask | Remarks |
| --- | --- | --- |
| Fuse circuit | 0000 . . . 0000 | entirely "0" |
| Entire inversion fuse circuit | 1111 . . . 1111 | entirely "1" |
| Upper inversion fuse circuit | 1111 . . . 0000 | entirely "1" in upper n/2 bits, entirely "0" in lower n/2 bits |
| Lower inversion fuse circuit | 0000 . . . 1111 | entirely "0" in upper n/2 bits, entirely "1" in lower n/2 bits |

As described above, the types of fuse circuits prepared in this embodiment are arbitrary, and fuse circuits having other masks may be provided. Naturally, the number of bits of each mask is "n", and coincides with the number of bits of the address to be stored.

In this embodiment, the address to be stored is assigned to the optimum fuse circuit by using the masks of the respective fuse circuits. A method for this assignment will be specifically described below.

Figure 21:
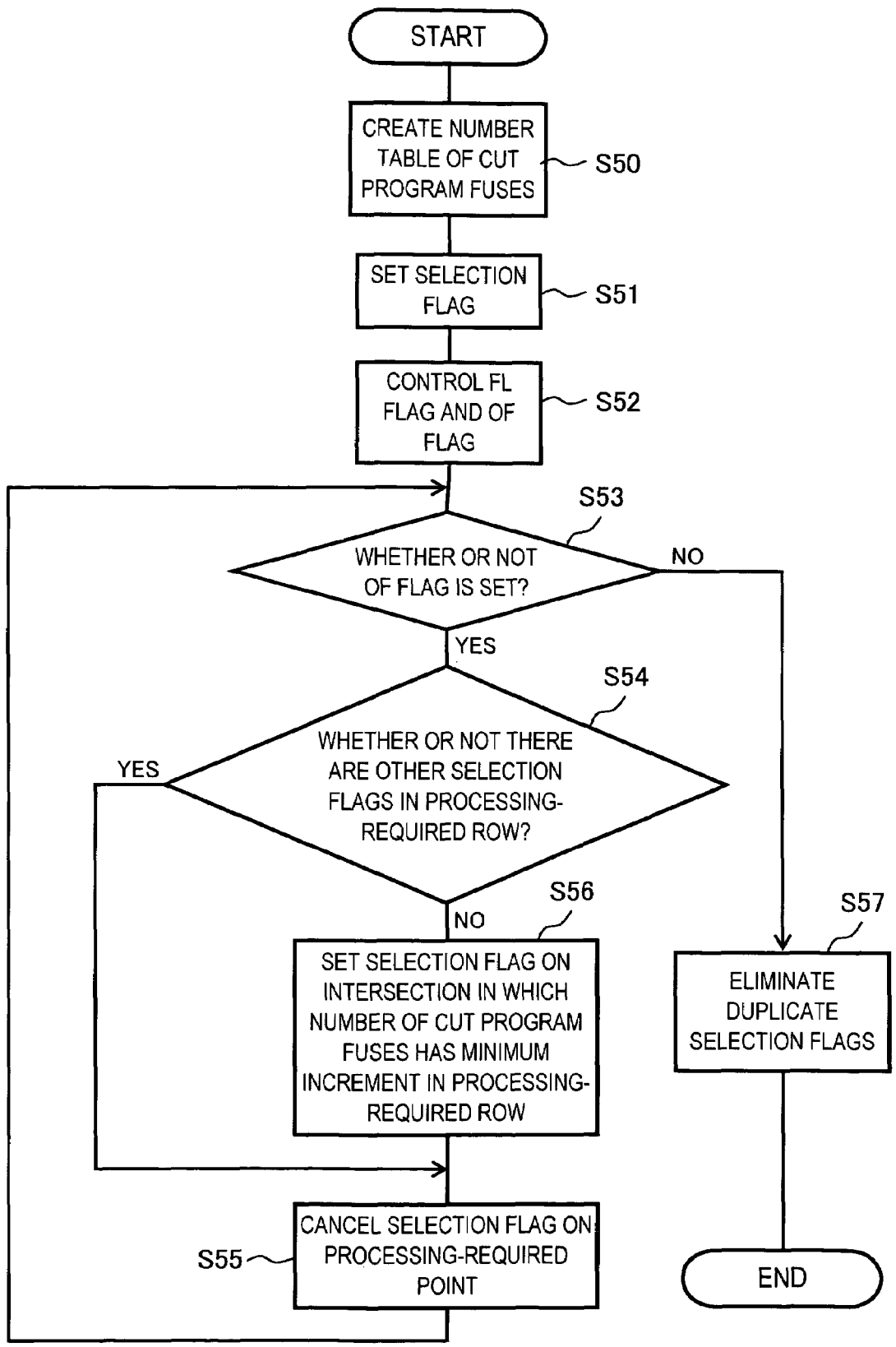
FIG. 21 is a flowchart for explaining a preferable method for deciding the fuse circuit for use in the fourth embodiment.

FIG. 21 is a flowchart for explaining a preferable method for deciding the fuse circuit for use in this embodiment.

First, a table of the numbers of cut program fuses is created (Step S50). A configuration of the table of the numbers of cut program fuses is shown as an example in FIG. 22, and the table has a matrix structure of plural addresses to be stored (ADDRESS#1 to ADDRESS#8 in this example) and prepared plural types of fuse circuits (fuse circuits 11A to 11H in this example). Moreover, into each of intersections (squares) of both of the above, the required number of cut program fuses is written (the numbers of cut program fuses are a mere example).

Each written number of cut program fuses shows the required number of cut program fuses in the case of allowing the fuse circuit corresponding to the column direction to store the address corresponding to the row direction. For example, the table shows that, in the case of allowing the respective fuse circuits to store the ADDRESS#1 shown in FIG. 22, it is necessary to cut ten program fuses when the fuse circuit 11A is used, and it is necessary to cut three program fuses when the fuse circuit 11B is used.

The number of cut program fuses can be calculated by performing an exclusive OR operation for each bit of the address to be stored and the bit to which the mask of each fuse circuit corresponds.

A specific example will be described. In the case where the bit configuration of the ADDRESS#1 and the mask of the fuse circuit 11A are as shown in Table 2, when the exclusive OR operation is performed for the bits corresponding to each other, bits becoming "0" are two, and bits becoming "1" are ten. Meanwhile, in the case where the bit configuration of the ADDRESS#1 and the mask of the fuse circuit 11B are as shown in Table 3, when the exclusive OR operation is performed for the bits corresponding to each other, bits becoming "0" are nine, and bits becoming "1" are three.

TABLE 2

| | ADDRESS#1 | | | | | | | | | | | |
| --- | --- | --- | --- | --- | --- | --- | --- | --- | --- | --- | --- | --- |
| | 0 | 0 | 0 | 1 | 0 | 1 | 0 | 1 | 1 | 0 | 1 | 0 |
| Mask of fuse circuit 11A | 1 | 0 | 1 | 0 | 1 | 0 | 1 | 1 | 0 | 1 | 0 | 1 |
| Result of operation | 1 | 0 | 1 | 1 | 1 | 1 | 1 | 0 | 1 | 1 | 1 | 1 |

TABLE 3

| | ADDRESS#1 | | | | | | | | | | | |
| --- | --- | --- | --- | --- | --- | --- | --- | --- | --- | --- | --- | --- |
| | 0 | 0 | 0 | 1 | 0 | 1 | 0 | 1 | 1 | 0 | 1 | 0 |
| Mask of fuse circuit 11B | 0 | 0 | 0 | 0 | 1 | 1 | 0 | 1 | 1 | 1 | 1 | 0 |
| Result of operation | 0 | 0 | 0 | 1 | 1 | 0 | 0 | 0 | 0 | 1 | 0 | 0 |

Here, each bit which has become "0" by the operation is a bit for which the program fuse is not to be cut in the case of using the fuse circuit concerned, and each bit which has become "1" by the operation is a bit for which it is necessary to cut the program fuse in the case of using the program fuse concerned. Hence, if the number of bits which have become "1" as a result of the operation is counted, then the number of cut program fuses can be calculated.

In the above-described example, in the case of allowing the fuse circuit 11A to store the ADDRESS#1, it will be necessary to cut ten program fuses, and in the case of allowing the fuse circuit 11B to store the ADDRESS#1, it will be necessary to cut three program fuses. In this case, in the table of the number of cut program fuses, "10" is written into the intersection of the ADDRESS#1 and the fuse circuit 11A, and "3" is written into the intersection of the ADDRESS#1 and the fuse circuit 11B. Such an operation is performed for the entire combinations of the addresses to be stored and the prepared fuse circuits, and the table of the number of cut program fuses as shown in FIG. 22 is created.

Next, a selection flag is set on an intersection into which the minimum number of cut program fuses is written for each address (Step S51). However, an intersection in which the number of cut program fuses is zero is prohibited from being selected. This is because a combination in which the number of cut program fuses is zero is regarded as in the unused state as already described, and the HIT detection cannot be performed therefor. In FIG. 22, symbols ◯ (single circle) or ⊚ (double circle) are indicated on the intersections on which the selection flags are set. The intersection into which the minimum number of cut program fuses is written is not limited to one in each address, and may be two or more. In this case, the selection flags are set on the entire intersections into which the minimum number of cut program fuses is written.

Next, the number of selection flags is counted for each type of the fuse circuits, and based on a result thereof, a FULL flag (FL flag) and an overflow flag (OF flag) are set (or cancelled) (Step S52). The FL flag and the OF flag are flags assigned for each type of the fuse circuits, and among them, the FL flag is set when the number of selection flags included in the column corresponding thereto coincide to or exceed the number of fuse circuits concerned, and the OF flag is set when the number of selection flags included in the column corresponding thereto exceeds the number of program fuses concerned.

As an example, the case where the number of the respective fuse circuits is "two" is shown in FIG. 22. In this example, the FL flags are set when two or more selection flags are set (in the fuse circuits 11B, 11C and 11G), and the OF flags are set when three or more selection flags are set (in the fuse circuits 11B and 11G).

Next, it is determined whether or not at least one OF flag is set (Step S53). As a result, when no OF flag is set (Step S53: NO), duplicate selection flags are eliminated from each address (Step S57), and a series of the processing is completed. A method for eliminating the duplicate selection flags is arbitrary, and any selection flag may be eliminated as long as only one selection flag will be set for each address. Then, a fuse circuit corresponding to an intersection on which the selection flag is finally set will be the selected fuse circuit.

Meanwhile, as in the example shown in FIG. 22, when at least one OF flag is set (Step S53: YES), it is necessary to eliminate some selection flags on the columns (the columns of the fuse circuits 11B and 11G in the example shown in FIG. 22, hereinafter referred to as "processing-required columns") on which the OF flags are set. In this case, attention is paid to the intersections (hereinafter referred to as "processing-required points", on which the symbols ⊚ (double circle) are indicated in FIG. 22) on which the selection flags are set in the processing-required columns. Then, it is determined whether or not other selection flags are set on the rows (for example, the rows of the ADDRESSES#1, #2, #5, #6, #7 and #8 in FIG. 22, hereinafter referred to as "processing-required rows") to which the processing-required points belong (Step S54). Specifically, it is determined whether or not the duplication of the selection flags exists.

Note that, in the example shown in FIG. 22, the rows of the ADDRESSES#1, #5 and #7 are processing-required rows related to the fuse circuit 11B, and the rows of the ADDRESSES #2, #6, #7 and #8 are processing-required rows related to the fuse circuit 11G. The row of the ADDRESS#7 is related to both of the fuse circuits 11B and 11G.

As a result of such a determination, when the other selection flag is set on the processing-required row (Step S54: YES), the selection flag on the processing-required point is cancelled, and "zero" is overwritten thereinto as the number of cut program fuses (Step S55).

Here, when the plurality of processing-required points are included in the processing-required row (the row of the ADDRESS#7 in the example shown in FIG. 22), the selection flag belonging to the column (the column of the fuse circuit 11G) in which the processing-required points are more is preferentially cancelled. Then, returning to Step S52, contents of the FL flag and the OF flag are updated. Specifically, as a result of performing the processing of Step S55, if the FL flag and the OF flag to be cancelled exist, then these flags are cancelled.

FIG. 23 shows a result of repeatedly performing the above-described processing (S52 to S55) for the table of the number of cut program fuses, which is shown in FIG. 22. As shown in FIG. 23, it is understood that an overflow of the fuse circuit 11B is solved by the above-described processing.

As described above, according to the above-described processing, the optimum assignment of the fuse circuits can be performed without increasing the number of cut program fuses. Note that the overwriting of "zero" into the intersection from which the selection flag is cancelled is processing for preventing the selection flag from being set again on the intersection concerned.

Meanwhile, even if the processing of Steps S52 to S55 is repeatedly executed, when the processing-required row and the processing-required column are still left, in other words, when the duplicate selection flags do not exist on the processing-column (Step S54: NO), then, among the intersections belonging to the processing-required column, the selection flag is set on the intersection into which the number of cut program fuses is written, the number having the minimum increment with respect to the number of cut program fuses, which is written into the processing-required point (Step S56).

At this time, the intersections on the column (for example, the column of the fuse circuit 11C in FIG. 23, hereinafter referred to as a "prohibited column") on which the FL flag is set are set to be out of the subject to be selected. This is because, when the selection flag is set on the intersection belonging to the prohibited column, the OF flag is set on the prohibited column, and a new processing-required column is undesirably generated.

Then, the processing proceeds to Step S55, where the selection flag on the processing-required point is canceled, and "zero" is overwritten thereinto as the number of cut program fuses. Moreover, returning to Step S52, the contents of the FL flag and the OF flag are updated.

FIG. 24 shows a result of executing the above-described processing (S56, S55 and S52) for the table of the number of cut program fuses, which is shown in FIG. 23. Specifically, at the stage shown in FIG. 23, three processing-required rows (ADDRESSES#2, #6 AND #8) exist. Among them, with regard to the ADDRESS#2, when the intersection corresponding to the fuse circuit 11C is selected, the increment thereof becomes "1" as the minimum number. However, since the column of the fuse circuit 11C is the prohibited column, the intersection cannot be selected. Accordingly, the selectable column is the fuse circuit 11E, and in this case, the increment is "2".

Meanwhile, with regard to the ADDRESS#6, when the intersection corresponding to the fuse circuit 11H is selected, the increment thereof becomes the minimum, and also in this case, the increment is "2". Moreover, with regard to the ADDRESS#8, when the intersection corresponding to the fuse circuit 11C or the fuse circuit 11H is selected, the increment thereof becomes the minimum, and in this case, the increment is "1". However, since the column of the fuse circuit 11C is the prohibited column, the column concerned cannot be selected.

From the above, it is determined that the intersection on which the selection flag is to be set is the intersection corresponding to the ADDRESS#8 and the fuse circuit 11H. As shown in FIG. 24, the selection flag is set on the intersection concerned, and the selection flag on the intersection corresponding to the ADDRESS#8 and the fuse circuit 11G is cancelled. As a result, an overflow of the fuse circuit 11G is solved, and the OF flag corresponding to the fuse circuit 11G will be cancelled. As described above, according to the above-described processing, the optimum assignment of the fuse circuits can be performed while minimizing the increase of the number of cut program fuses.

When the elimination of the OF flags is completed (Step S53: NO) by repeating the processing (S52 to S56) as described above, the duplicate selection flags are eliminated from each address (S57), and a series of the processing is completed. As described above, the fuse circuit corresponding to the intersection on which the selection flag is finally set for each address will be the selected fuse circuit. Such a series of the processing can also be executed by the software process of the computer, and the fuse cutting apparatus is controlled based on a result obtained by the process concerned.

According to this embodiment, it is made possible to always minimize the number of program fuses to be cut irrespective of the types and number of the prepared fuse circuits. In addition, in this embodiment, as the types of the prepared fuse circuits are more, the number of program fuses to be cut can be reduced as a whole. Thus, according to this embodiment, it is made possible to further reduce the manufacturing cost of the semiconductor device 100, and in addition, it is made possible to further enhance the reliability of the semiconductor device 100 as an end product.

The present invention is in no way limited to the aforementioned embodiments, but rather various modifications are possible within the scope of the invention as recited in the claims, and naturally these modifications are included within the scope of the invention.

For example, in each of the respective embodiments described above, the fuse circuits of a dynamic type, which perform the precharge operation in synchronization with the timing signals (S1 to S3), are used. However, the present invention is not limited to this, and for example, it is also possible to use fuse circuits of a static type. The fuse circuits of the dynamic type are suitable for application to a semiconductor device such as the DRAM which performs a dynamic operation, and the fuse circuits of the static type are suitable for application to a semiconductor device such as an SRAM which performs a static operation.

Moreover, in each of the respective embodiments described above, the storage circuits are used, in each of which the output rises to the high level by cutting the fuse element; however, it is also possible to use storage circuits in each of which the output drops to the low level by cutting the fuse element.

What is claimed is:

1. A semiconductor device comprising:
   a set of address nodes supplied with an access address to select at least one memory cell;
   a first storage circuit including a plurality of first fuses to store first address information;
   a first enable circuit including a second fuse that is programmed independently of the first address information, the first enable circuit producing a first control signal that takes one of active and inactive levels in accordance with a programmed state of the second fuse;
   a first hit detection unit detecting whether the access address matches the first address information, the first hit detection unit coupled to the set of address nodes, the first storage circuit and the first enable circuit to receive the access address, the first address information and the first control signal, the first hit detection unit being enabled by the active level of the first control signal to produce a match signal when the access address takes the first address information;
   a second storage circuit including a plurality of third fuses to store second address information;
   a second enable circuit including a fourth fuse that is programmed independently of the second address information, the second enable circuit producing a second control signal that takes one of active and inactive levels in accordance with a programmed state of the fourth fuse; and
   a second hit detection unit coupled to the set of address nodes, the second storage circuit and the second enable circuit to receive the access address which is the same as the access address to be detected by the first hit detection unit, the second address information and the second control signal, the second hit detection unit being enabled by the active level of the second control signal to produce a match signal when the access address which is the same as the access address to be detected by the first hit detection unit takes third address information that is different from and based on the second address information and is different from the first address information.

2. The device as claimed in claim 1, wherein each of the second and third address information comprises a plurality of bit data, at least one of the bit data of the third address information is inverted in logic level from an associated one of the bit data of the second information.

3. The device as claimed in claim 1, wherein each of the second and third address information comprises a plurality of bit data, the third address information is inverted in all the bit data from the second information.

4. A semiconductor device comprising:
   a plurality of address input nodes supplied with an access address designating at least one memory cell to be accessed, the access address being composed of a plurality of bits;
   a first storage circuit including a plurality of first fuses and generating first address information responsive to a combination in blown or non-blown state of the first fuses, the first address information being equal in number of bits to the access address;
   a second storage circuit including a plurality of second fuses and generating second address information responsive to a combination in blown or non-blown state of the second fuses, the second address information being equal in number of bits to the access address, the second address information thereby becoming identical to the first address information when the combination in blown or non-blown state of the first fuses is identical to the combination in blown or non-blown state of the second fuses;
   a first enable circuit including a third fuse and supplying a first control signal that takes one of active and inactive levels in response to a blown or non-blown state of the third fuse;
   a second enable circuit including a fourth fuse and supplying a second control signal that takes one of active and inactive levels in response to a blown or non-blown state of the fourth fuse;
   a first hit detection unit detecting whether the access address matches the first address information, the first hit detection unit coupled to the first enable circuit, the first storage circuit and the address input nodes, the first hit detection unit being enabled by the active level of the first control signal to compare each of the bits of the first address information with an associated one of the bits of the access address and produce a first match signal when the access address is identical with the first address information; and
   a second hit detection unit coupled to the second storage circuit to change the second information to third information, the third information being equal in number of bits to and different in content from the second address information, the second hit detection unit being further coupled to the second enable circuit and the address input nodes and enabled by the active level of the second control signal to compare each of the bits of the third information with an associated one of the bits of the access address, which is the same as the access address to be detected by the first hit detection unit, and produce a second match signal when the access address which is the same as the access address to be detected by the first hit detection unit is identical with the third information and is different from the first address information.

5. The device as claimed in claim 4, wherein the second hit detection unit includes at least one inverter which inverts a logic level of an associated one of the bits of the second information to produce an inverted logic level, an associated one of the bits of the third information thereby including the inverted logic level.

6. The device as claimed in claim 4, wherein the second hit detection unit includes a plurality of inverters which are equal in number to the bits of the second information, each of the inverters inverting a logic level of an associated one of the bits of the second information to produce the third information.

7. A semiconductor device comprising:
a plurality of first storage circuits, each of the first storage circuits including a plurality of first fuses to store first data responsive to a combination of blown or not-blown state of the first fuses;
a plurality of first enable circuits, each of the first enable circuits including a second fuse to produce a first control signal that takes one of active and inactive levels;
a plurality of second storage circuits, each of the second storage circuits including a plurality of third fuses to store second data responsive to a combination of blown or not-blown state of the third fuses;
a plurality of second enable circuits, each of the second enable circuits including a fourth fuse to produce a second control signal that takes one of active and inactive levels;
a set of address input nodes supplied with an access address to designate at least one memory cell to be accessed;
a plurality of first hit detection circuits coupled in common to the set of address input nodes to receive the access address in parallel to each other, each of the first hit detection circuits being further coupled to an associated one of the first storage circuits and an associated one of the first enable circuits, each of the first hit detection circuits being enabled by the active level of an associated one of the first control signal to produce a first match signal when the access address is coincident with an associated one of the first data;
a plurality of data change circuits, each of the data change circuits being coupled to an associated one of the second storage circuits to change an associated one of the second data to third data; and
a plurality of second hit detection circuits coupled in common to the set of address input nodes to receive the access address in parallel to each other and to the first hit detection circuits, each of the second hit detection circuits being further coupled to an associated one of the data change circuits and an associated one of the second enable circuits, each of the second hit detection circuits being enabled by the active level of an associated one of the second control signal to produce a second match signal when the access address is coincident with an associated one of the third data and is different from the associated one of the first data.

8. The device as claimed in claim 7, wherein each of the data change circuits includes at least one inverter circuit that inverts a logic level of an associated one of bits of the second data to produce an inverted logic level, the third data including the inverted logic level.

9. The device as claimed in claim 7, wherein each of the data change circuits includes a plurality of inverter circuits that invert logic levels of all bits of the second data to produce the third data.

* * * * *